(12) United States Patent
Kim

(10) Patent No.: US 6,337,495 B1
(45) Date of Patent: Jan. 8, 2002

(54) SOLID-STATE IMAGE PICKUP DEVICE

(75) Inventor: Yong Gwan Kim, Kurokawa-gun (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 21 days.

(21) Appl. No.: 09/588,228

(22) Filed: Jun. 6, 2000

(30) Foreign Application Priority Data

Jun. 8, 1999 (JP) .......................................... 11-161248

(51) Int. Cl.[7] ...................... H01L 27/148; H01L 29/768
(52) U.S. Cl. ...................... 257/232; 257/233; 257/241; 257/243
(58) Field of Search ................................. 257/232, 233, 257/241, 243

(56) References Cited

U.S. PATENT DOCUMENTS

| 5,514,887 A | * | 5/1996 | Hokari | 257/222 |
| 5,619,049 A | * | 4/1997 | Kim | 257/223 |
| 5,744,831 A | * | 4/1998 | Tanaka | 257/225 |

* cited by examiner

Primary Examiner—Ngâ V. Ngô
(74) Attorney, Agent, or Firm—Arent Fox Kintner Plotkin & Kahn PLLC

(57) ABSTRACT

In forming a photodiode by forming a burying layer on a charge accumulation region, the readout gate channel for the photodiode is separated from a high impurity concentration region of the burying layer of the photodiode, and at least a partial area of the high impurity concentration region is separated from the channel stopper region of the photodiode. Noises of a solid-state image pickup device using buried type photodiodes can be reduced.

20 Claims, 15 Drawing Sheets

SOLID-STATE IMAGE PICKUP DEVICE

This application is based on Japanese Patent Applications HEI 11-161248 filed on Jun. 8, 1999 and 2000-165315 filed on Jun. 2, 2000, the entire contents of which are incorporated herein by reference.

BACKGROUND OF THE INVENTION a) Field of the Invention

The present invention relates to a solid-state image pickup device using photodiodes.

b) Description of the Related Art

A schematic cross sectional view of a conventional solid-state image pickup device is shown in FIG. 15 in its upper area.

A photodiode is made of a p-type semiconductor well region 51 and an n-type semiconductor region 54 (hereinafter called a "charge accumulation region 54") respectively formed on a principal surface of a semiconductor substrate, and a $p^+$-type semiconductor region 55 (hereinafter called a "burying layer 55") formed on the surface of the charge accumulation region 54. Formed in the p-type semiconductor well region 51 are an n-type semiconductor region 53 (hereinafter called a "charge transfer channel 53") for forming a charge transfer path and a p-type semiconductor region 52 (hereinafter called a "channel stopper region 52") for forming a channel stopper.

On the surface of the semiconductor substrate having these regions, an electrode 57 having a predetermined pattern is formed, with an insulating film 56 being interposed therebetween. The electrode 57 covers the upper area of a partial area (hereinafter called a "readout gate channel 51a") of the p-type semiconductor well region 51 between the charge accumulation region 54 and charge transfer channel 53.

The burying layer 55 covering the charge accumulation region 54 captures the centers of electron-hole pair generation recombination (GR) formed at the interface between the semiconductor substrate surface and insulating film 56, and recombines electron-hole pairs generated in the GR centers. Generation of noises can therefore be suppressed. The burying layer 55 has also a function of increasing a pn junction area of the photodiode and improving the photosensitivity.

The left end of this burying layer 55 connects the channel stopper region 52 and the right end thereof connects the readout gate channel 51a. The connection area between the burying layer 55 and channel stopper region 52 is not only that shown in FIG. 15. The burying layer 55 and channel stopper region 52 also connect together at the outer periphery of the charge accumulation region 54 as viewed in plan, excepting the area connected to the readout gate channel 51a.

After the channel stopper region 52, charge transfer channel 53, charge accumulation region 54 and the like are formed, the burying layer 55 is formed by ion-implanting p-type impurities into the surface area of the charge accumulation region 54 to form a $P^+$-type region and thereafter activating these p-type impurities by a heat treatment. This ion-implantation is performed by aligning an outer edge of an ion-implantation region with the channel stopper region 52.

Another solid-state image pickup device is known which has a similar structure as that shown in FIG. 15 excepting that the right end of the burying layer 55 is slightly spaced apart from the readout gate channel 51a.

The middle area of FIG. 15 shows a potential P1 relative to electrons near the surface of the semiconductor substrate when 0 V is applied to the electrode 57.

In this specification, the region having a deeper potential well while a voltage is applied is called as "the region has a higher potential", and the region having a shallower potential well is called as "the region has a lower potential".

The channel stopper region 52 is at the ground potential. The potentials at the charge accumulation region 54 and charge transfer channel 53 are higher than the potential at the channel stopper region 52. The potential at the readout gate channel 51a is lower than the potentials at the charge accumulation region 54 and charge transfer channel 53.

As light becomes incident upon the photodiode, the photodiode absorbs incidence light and generates electric charge. The charge accumulation region 54 accumulates electric charge (electrons) Q corresponding to a quantity of light. The photodiode corresponds to a pixel, and the accumulated charge Q corresponds to a pixel signal.

The readout gate channel 51a prevents the charge Q from moving from the photodiode to the change transfer channel 53. Namely, the readout gate channel 51a forms a potential barrier.

The lower area of FIG. 15 shows a potential P2 relative to electrons near the surface of the semiconductor substrate while a readout pulse is applied to the electrode 57 to transfer electric charge accumulated in the photodiode to the charge transfer channel 53. The channel stopper region 52 is at the ground potential also in this case.

As the readout pulse of, for example, 15V is applied to the electrode 57, the electron potential at the semiconductor region under the electrode 57 becomes high. Since the potential at the readout gate channel 51a becomes high, the function as the potential barrier is degraded. Electric charge Q in the charge accumulation region 54 flows into the charge transfer channel 53. At the readout pulse of about 15 V, a low potential barrier may remain at the readout gate channel 51a.

If such a potential barrier is left at the readout gate channel 51a, only some electric charge Q2 of the electric charge Q is transferred to the charge transfer channel 53, and some other electric charge Q1 is left in the charge accumulation region 54. The electric charge Q1 appears as noise on an image. This noise is retained image noise. Noises different from retained image noise are also generated.

Retained image noise can be reduced if the potential of the readout pulse is raised. The potential barrier formed in the readout gate channel 51a can be lowered if the right end of the burying layer 55 is slightly spaced apart from the readout gate channel 51a even if the potential of the readout pulse is set to, for example, 15 V.

Even if the right end of the burying layer 55 is slightly spaced apart from the readout gate channel 51a, it is difficult to suppress generation of noises other than retained image noise.

SUMMARY OF THE INVENTION

It is an object of the present invention to provide a solid-state image pickup device capable of suppressing generation of noises.

According to one aspect of the present invention, there is provided a solid state image pickup device comprising: a semiconductor substrate formed with a semiconductor well region on a principal surface side; a charge accumulation region column having a plurality of charge accumulation regions formed in the semiconductor well region, each of the charge accumulation regions having a conductivity type opposite to a conductivity type of the semiconductor well region; a charge transfer channel formed in the semiconductor well region adjacent to said charge accumulation region column and extending along said charge accumulation region column, said charge transfer channel having the conductivity type opposite to the conductivity type of the semiconductor well region; a readout gate channel formed in the semiconductor well region for each charge accumulation region, said readout gate channel having a conductivity type same as the conductivity type of the semiconductor well region and being contiguous to a corresponding charge accumulation region and said charge transfer channel; a channel stopper region formed in the semiconductor well region and extending at least along said charge accumulation region column on an opposite side of said charge transfer channel relative to a center line of said charge accumulation region column, said channel stopper region having the conductivity type same as the conductivity type of the semiconductor well region and an impurity concentration higher than an impurity concentration of the semiconductor well region; and a burying layer formed on each charge accumulation region and being separated from said readout gate channel and electrically connected to said channel stopper region, said burying layer together with the charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated from said channel stopper region at least one area on the opposite side of said charge transfer channel relative to the center line of said charge accumulation region column.

According to another aspect of the present invention, there is provided a solid state image pickup device comprising: a semiconductor substrate formed with a semiconductor well region on a principal surface side; a number of charge accumulation regions formed in the semiconductor well region in a matrix form of a plurality of rows and columns, each of said charge accumulation regions having a conductivity type opposite to a conductivity type of the semiconductor well region; a charge transfer channel formed for each charge accumulation region column in the semiconductor well adjacent to and along the charge accumulation region column, said charge transfer channel having the conductivity type opposite to the conductivity type of the semiconductor well region; a readout gate channel formed in the semiconductor well region for each charge accumulation region, said readout gate channel having a conductivity type same as the conductivity type of the semiconductor well region and being contiguous to a corresponding charge accumulation region and said charge transfer channel corresponding to the charge accumulation region; one or a plurality of channel stopper regions formed in the semiconductor well region and including one area for each charge accumulation region column extending along each charge accumulation region column, the one area existing on an opposite side of said charge transfer channel corresponding to the charge accumulation region column relative to a center line of the charge accumulation region column, said channel stopper region having the conductivity type same as the conductivity type of the semiconductor well region and an impurity concentration higher than an impurity concentration of the semiconductor well region; a number of readout/transfer electrodes and transfer-only electrodes formed on said semiconductor substrate via an electrically insulating film, each of said readout/transfer electrodes being provided for each charge accumulation region row, extending along the charge accumulation region row, and covering as viewed in plan said readout gate channel corresponding to each of said charge accumulation regions of the charge accumulation region row, each of said transfer-only electrodes being provided at least for each charge accumulation region row and extending along the charge accumulation region row, said readout/transfer electrode and said transfer-only electrode surrounding as viewed in plan each of said charge accumulation regions of the charge accumulation region row; and a burying layer formed on each of said charge accumulation regions and being separated from said readout gate channel and electrically connected to said channel stopper region, said burying layer together with said charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated as viewed in plan from said readout/transfer electrode corresponding to said charge accumulation region under the high impurity concentration region.

According to still another aspect of the present invention, there is provided a solid state image pickup device comprising: a semiconductor substrate formed with a semiconductor well region on a principal surface side; a number of charge accumulation regions formed in the semiconductor well region in a matrix form of a plurality of rows and columns, each of said charge accumulation regions having a conductivity type opposite to a conductivity type of the semiconductor well region; a charge transfer channel formed for each charge accumulation region column in the semiconductor well adjacent to and along the charge accumulation region column, said charge transfer channel having the conductivity type opposite to the conductivity type of the semiconductor well region; a readout gate channel formed in the semiconductor well region for each charge accumulation region, said readout gate channel having a conductivity type same as the conductivity type of the semiconductor well region and being contiguous to a corresponding charge accumulation region and said charge transfer channel corresponding to the charge accumulation region; one or a plurality of channel stopper regions formed in the semiconductor well region and including one area for each charge accumulation region column extending along each charge accumulation region column, the one area existing on an opposite side of said charge transfer channel corresponding to the charge accumulation region column relative to a center line of the charge accumulation region column, said channel stopper region having the conductivity type same as the conductivity type of the semiconductor well region and an impurity concentration higher than an impurity concentration of the semiconductor well region; a number of readout/transfer electrodes formed on said semiconductor substrate via an electrically insulating film, said readout/transfer electrodes including a first readout/transfer electrodes each of which extending along an associated charge accumulation region row of said a plurality of rows on an immediately upstream side of the charge accumulation region row and a second readout/transfer electrodes each of which extending along an associated charge accumulation region row of said a plurality of rows on an immediately downstream side of the charge accumulation region row, the first and second readout/transfer electrodes provided for each charge accumulation region row surround as viewed in plan each of said charge accumulation regions of the charge accumulation region row; and a burying layer formed on each of said charge accumulation regions and being separated from said readout gate channel and electrically connected to said channel stopper region, said burying layer together with said charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated as viewed in plan from the first and second readout/transfer electrodes surrounding as viewed in plan the charge accumulation region under the high impurity concentration region.

DETAILED DESCRIPTION OF THE PREFERRED EMBODIMENTS

The present inventor has vigorously studied the reasons of noises other than retained image noise of a solid-state image pickup device using photodiodes with burying layers, and obtained the following knowledge.

Figure 15:
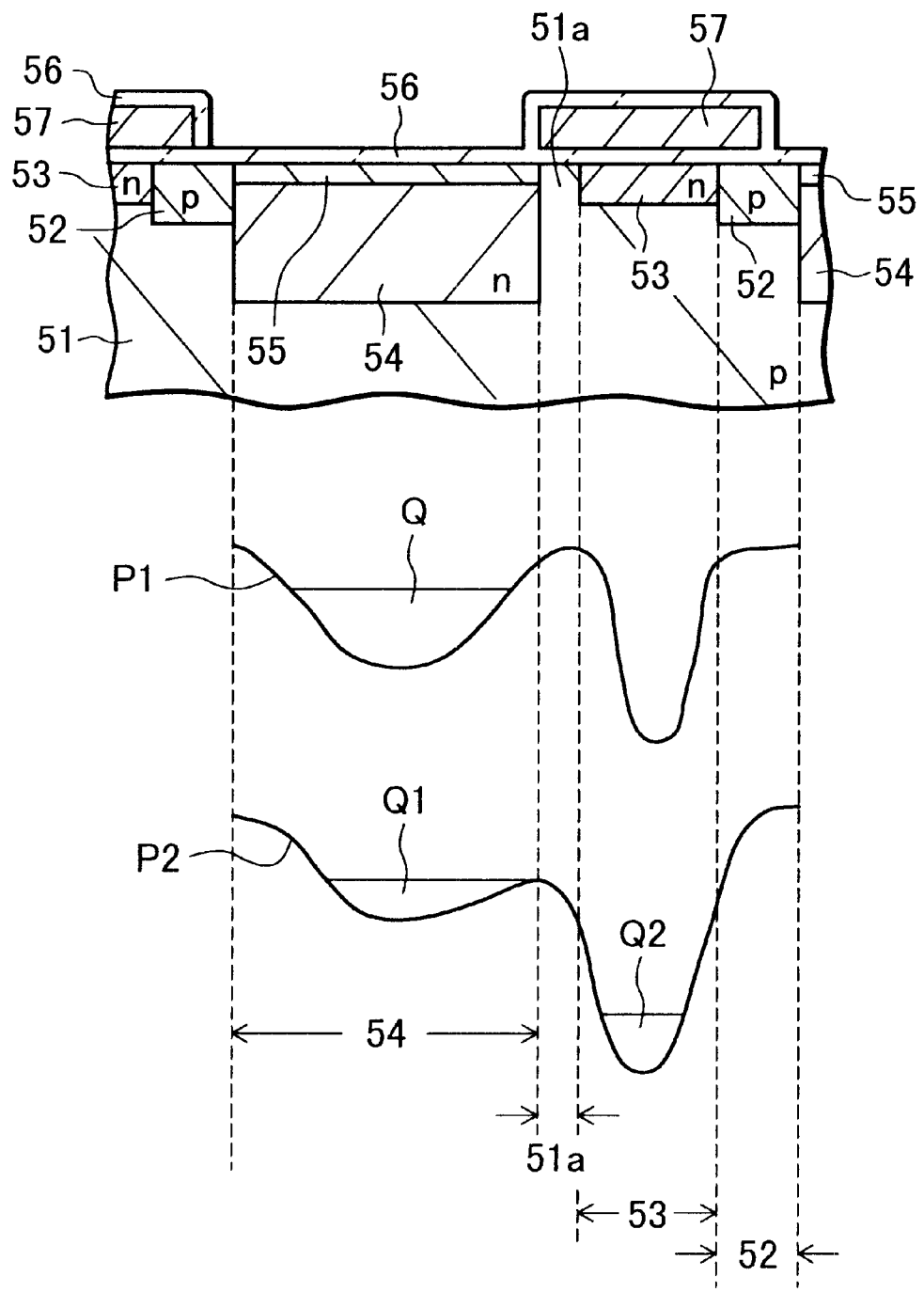
FIG. 15 shows a schematic cross sectional view of a conventional solid-state image pickup device and its potential diagrams.

It hasn't thought of a large current flowing between the charge transfer channel 53 and right side burying layer 55 shown in FIG. 15.

However, it has become certain that a large current actually flows instantaneously between the charge transfer channel 53 and right side burying layer 55. The reason for this may be ascribed to a method of forming the burying layer 55.

In forming the burying layer 55, ion-implantation is performed by aligning the outer edge of an ion-implantation region with the channel stopper region 52, and then a heat treatment for activation is performed. With this heat treatment, p-type impurities (p-type impurity atoms) are thermally diffused.

With this heat treatment, p-type impurities diffuse to the outside of a $p^+$-type region formed by the ion-implantation by about 50 to 80% of the thickness of the $p^+$-type region.

Therefore, thermally diffused p-type impurities reach the surface of the channel stopper region 52. The concentration of p-type impurities in the surface of the channel stopper region 52 becomes higher than that in the lower portion in the channel stopper region 52.

As described earlier, even if the readout pulse is applied to the electrode 57 shown in FIG. 15, the potential at the channel stopper region 52 is maintained at the ground potential.

Under such conditions, as the readout pulse is instantaneously applied to the electrode 57, a reverse bias is applied to the pn junction between the charge transfer channel 53 and right side channel stopper region 52. This reverse bias is applied to the pn junction particularly between the charge transfer channel 53 and the surface of the right side channel stopper region 52, because the concentration (carrier concentration) of p-type impurities in the surface of the channel stopper region 52 is made high by the p-type impurities thermally diffused from the burying layer 55.

This reverse bias breaks down the pn junction between the charge transfer channel 53 and the surface of the right side channel stopper region 52. A large current therefore flows instantaneously between the charge transfer channel 53 and right side burying layer 55.

This breakdown generates electron-hole pairs. Holes flow into the burying layer 55 connected to the right of the channel stopper region 52, and electrons flow into the charge transfer channel 53.

Holes entered the burying layer 55 will not become substantial noises. However, electrons entered the charge transfer channel 53 become noise signals. These noise signals appear as noises on an image.

If the breakdown is suppressed, noises can be reduced. In order to achieve this, the impurity concentration in the surface of the channel stopper region 52 is suppressed from becoming higher than that in the lower portion in the channel stopper region 52.

If the amount of p-type impurities reaching the surface of the channel stopper region 52 during the heat treatment for forming the burying layer 55 is reduced, it is possible to suppress the impurity concentration in the surface of the channel stopper region 52 from becoming much higher than that in the lower portion in the channel stopper region 52.

For example, if the $p^+$-type region to be formed by ion-implantation for forming the burying layer 55 is spaced from the channel stopper region 52, it is possible to reduce the amount of p-type impurities reaching the channel stopper region 52 by thermal diffusion.

The shape of the electrode 57 to which the readout pulse is applied may take various shapes in accordance with the specifications of solid-state image pickup devices. The shape of the channel stopper region 52 also may take various shapes.

Therefore, the size and shape of the burying layer 55 as viewed in plan are properly set in accordance with the specifications of solid state image pickup devices.

Figure 1:
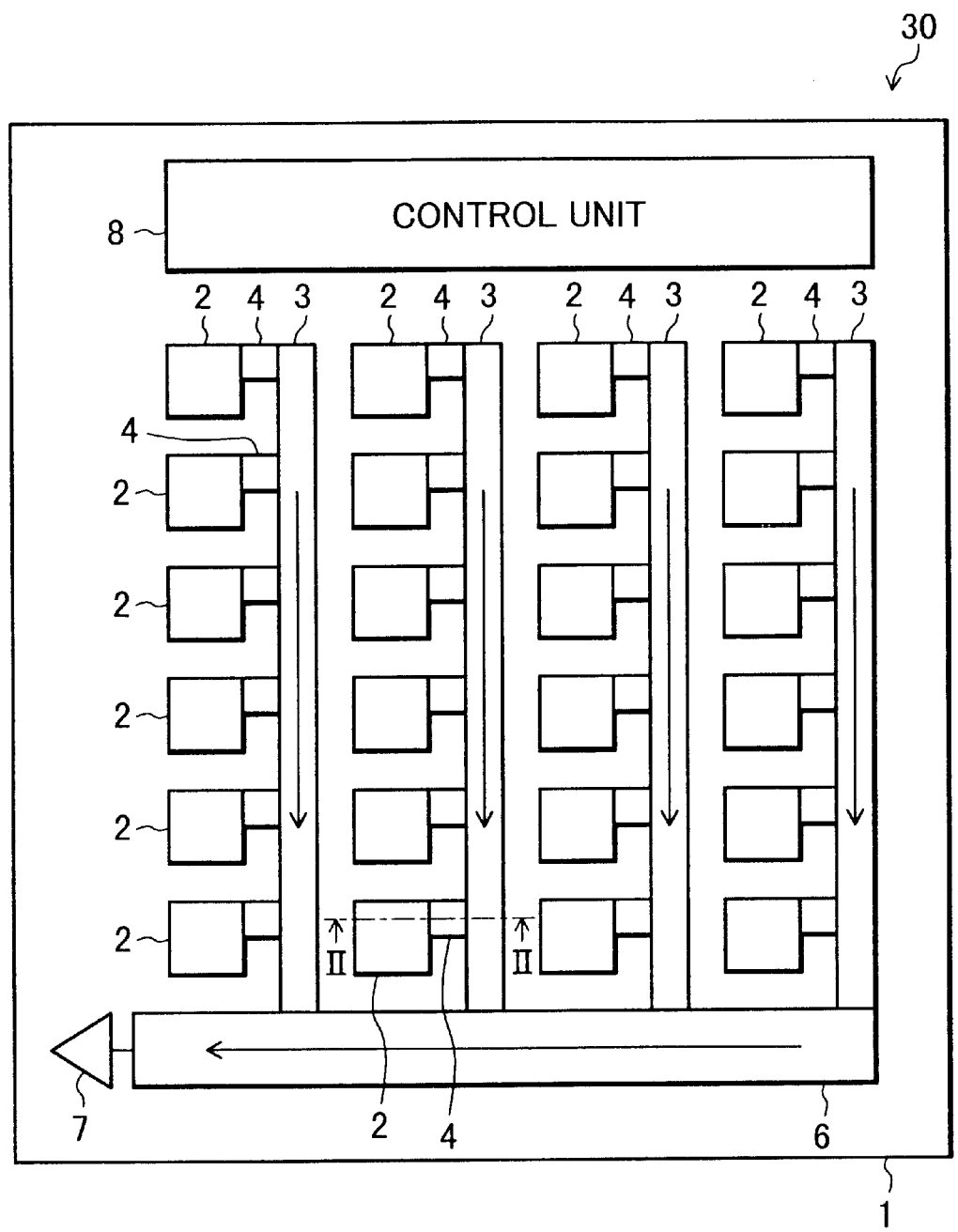
FIG. 1 is a schematic plan view of a solid-state image pickup device according to a first embodiment.

FIG. 1 is a schematic plan view of a solid-state image pickup device 30 according to the first embodiment. In the solid image pickup device 30, is formed on a The semiconductor substrate 1 has a plurality of photodiodes (photoelectric conversion elements) 2, vertical charge transfer paths (VCCD) 3, transfer gates (readout gates) 4, a horizontal charge transfer path (HCCD) 6 an output amplifier 7, and a control unit 8 are formed in a semiconductor substrate 1 made of silicon or the like. These constituent elements are formed as one semiconductor chip.

The photodiodes 2 are disposed in a two-dimensional matrix shape. Each photodiode converts received light into electric charge and stores the charge. A color filter is disposed on a light reception area of each photodiode 2. In order to make it easy to understand, 24 photodiodes (pixels) are drawn in FIG. 1. The number of photodiodes is not limited to this example. An actual solid-state image pickup device has photodiodes in the order of million.

Each vertical charge transfer path 3 is formed on the right side of each column of photodiodes 2 via readout gates 4. One vertical charge transfer path 3 is provided for each column of photodiodes 2. The readout gate 4 is used when electric charge in the corresponding photodiode is read out to the vertical charge transfer path 3.

The vertical charge transfer path 3 is made of charge coupled device (CCD) and transfers electric charges read out from the photodiodes 2 from the upper area of the drawing of FIG. 1 to the lower area (in a vertical direction). The electric charges read out from each of photodiodes of one photodiode-row are transferred toward the horizontal charge transfer path 6 at the same timing by each of the vertical charge transfer paths 3.

The horizontal charge transfer path 6 is made of CCD, receives electric charges transferred from the vertical charge transfer paths 3 and transfers the charges from the right area of the drawing of FIG. 1 to the left area (in a horizontal direction).

The output amplifier 7 outputs a voltage corresponding to the amount of electric charge transferred from the horizontal charge transfer path 6. This voltage value corresponds to a pixel value. Each photodiode 2 corresponds to a pixel. By disposing the photodiodes two-dimensionally, signals of a two-dimensional image can be obtained.

The control unit 8 controls the readout gates 4 for reading out electric charges from the photodiodes 2 to the vertical charge transfer paths 3, controls the vertical charge transfer paths 3 and horizontal charge transfer path 6, and/or controls to clear the electric charges in the photodiodes 2.

The details of the peripheral area of each photodiode 2 will be later given with reference to FIG. 3.

FIGS. 2A, 2B, 2C and 2D are cross sectional views, taken along line II—II of FIG. 1, of a substrate illustrating a manufacture method for the solid state image pickup device 30 of the first embodiment.

First, a semiconductor substrate is prepared by forming a p-type semiconductor well region by high-energy ion-implantation or the like in a principal surface of an n-type semiconductor substrate.

Figure 2A:
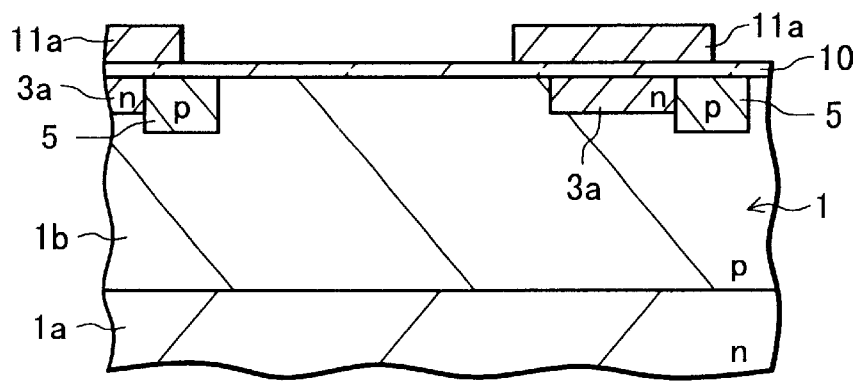
FIGS. 2A, 2B, 2C and 2D are cross sectional views of a substrate illustrating a manufacture method for the solid-state image pickup device of the first embodiment.

As shown in FIG. 2A, formed in predetermined areas of the semiconductor substrate 1, i.e., in the surface or on the surface of the p-type semiconductor well region 1b formed in the principal surface of the n-type semiconductor substrate 1a, are charge transfer channels 3a, a channel stopper regions 5, an insulating film (silicon oxide film) 10, readout/transfer electrodes 11a to which a readout pulse and a charge transfer drive pulse are applied, and transfer-only electrodes (not visible in FIG. 2A) to which only the charge transfer drive pulse is applied.

The charge transfer channel 3a is made of n-type semiconductor, and the channel stopper region 5 is made of $p^+$-type semiconductor. These channel and region are formed in the surface of the p-type semiconductor well region 1b by ion-implantation or the like. A concentration of p-type impurities in the $p^+$-type semiconductor is higher than that in the p-type semiconductor.

The charge transfer channel 3a is contiguous to the channel stopper region 5 in a horizontal direction (semiconductor in-plane direction). A plurality of charge transfer channels 3a and channel stopper regions 5 is formed periodically in the horizontal direction.

The insulating film (silicon oxide film) 10 is formed on the surface of the semiconductor substrate 1 by thermal oxidation, chemical vapor deposition (CVD) or the like.

The readout/transfer electrodes 11a and transfer-only electrodes are formed on the insulating film 10. The transfer-only electrodes are first formed, and then the surfaces of the transfer-only electrode are oxidized to form insulating films (silicon oxide films) to thereafter form the readout/transfer electrodes 11a. In order to form these transfer electrodes, a polysilicon film is formed on the insulating film 10. Thereafter, this polysilicon film is patterned by photolithography and etching to obtain a desired transfer electrodes. The polysilicon film for forming the transfer-only electrodes is different from a polysilicon film for forming the readout/transfer electrode 11a.

Figure 2B:
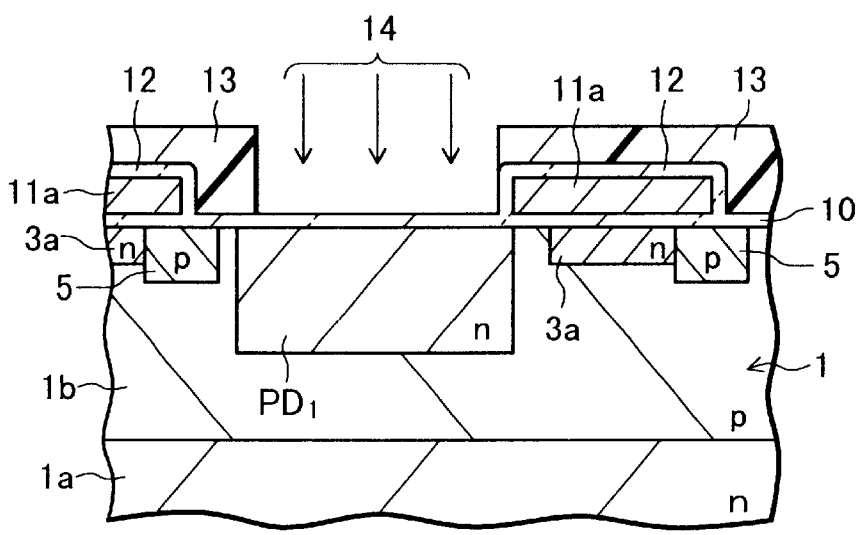

Next, as shown in FIG. 2B, the surfaces of the readout/transfer electrodes 11a are oxidized to form insulating films (silicon oxide films) 12, and a photoresist layer 13 having a predetermined pattern is formed over the substrate by photolithography. While the insulating films (silicon oxide films) 12 are formed, the surface of the semiconductor substrate 1 is also oxidized to increase the thickness of the insulating film 10. However, in this case, the growth degree of the insulating film 10 is low.

By using the photoresist layer 13 as a mask, n-type impurities (e.g., phosphorous) 14 are ion-implanted. For example, the ion-implantation conditions are a dose of $1 \times 10^{12}$ cm$^{-2}$ and acceleration energy of 300 to 800 keV. This ion-implantation forms n-type regions $PD_1$ for photodiodes in the surface of the p-type semiconductor well region 1b. The photoresist layer 13 is thereafter removed.

Each n-type region $PD_1$ is formed in an area spaced by predetermined distances from the nearby channel stopper region 5 and charge transfer channel 3a.

Figure 2C:
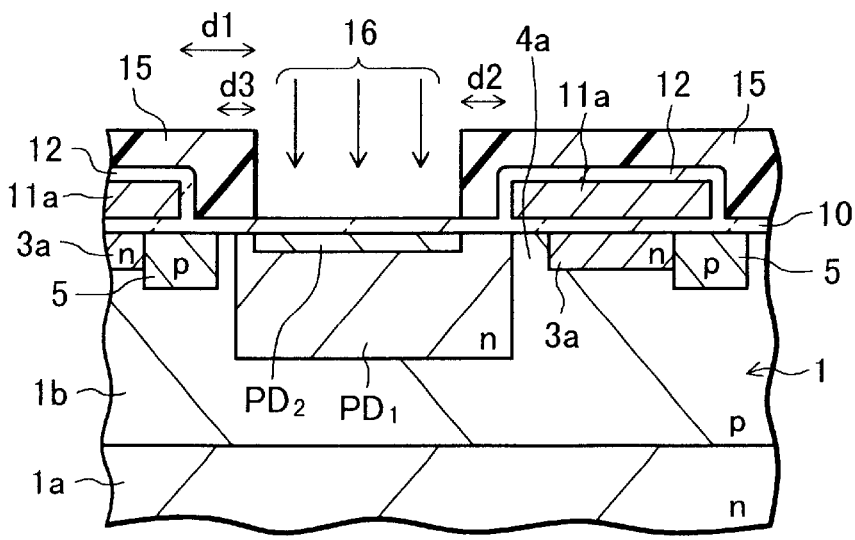

Next, as shown in FIG. 2C, a photoresist layer 15 having a predetermined pattern is formed over the substrate by photolithography. The photoresist layer 15 has a plurality of windows. The left end of each window in the photoresist layer 15 is spaced by a distance d1 (e.g., 0.4 μm) from the right end of the left readout/transfer electrode 11a in a horizontal direction, and by a channel stopper region 5 by a distance d3 (e.g., 0.2 μm) in the horizontal direction. The right end of the window in the photoresist layer 15 is spaced by a distance d2 (e.g., 0.7 μm) from the left end of the right readout/transfer electrode 11a in a horizontal direction.

By using the photoresist layer 15 as a mask, p-type impurities (e.g., boron) 16 are ion-implanted. For example, the ion-implantation conditions are a dose of $1 \times 10^{13}$ to $5 \times 10^{14}$ $cm^{-2}$ and acceleration energy of 20 to 80 keV. This ion-implantation forms a $p^+$-type region $PD_2$ for the photodiode in a partial surface of each n-type region $PD_1$.

After the photoresist layer 15 is removed, a heat treatment is performed to activate the n-type impurities in the n-type regions $PD_1$ and p-type impurities in the $p^+$-type regions $PD_2$.

With this heat treatment, n-type impurities are thermally diffused and the area of each n-type region $PD_1$ is broadened slightly to form a charge accumulation region for the photodiode. The charge accumulation region is hereinafter called a "charge accumulation region 2a".

Also with this heat treatment, p-type impurities are thermally diffused and the area of each $p^+$-type region $PD_2$ is broadened slightly to form a burying layer for the photodiode. The burying layer is hereinafter called a "burying layer 2b".

Figure 2D:
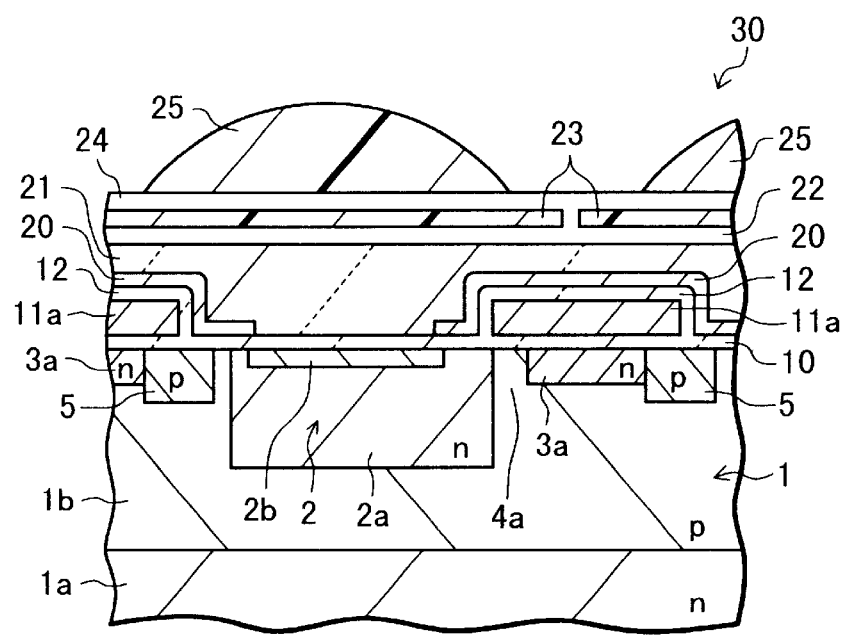

The region in the burying layer 2b having a generally constant concentration of p-type impurities, i.e., the region where the $p^+$-type region $PD_2$ before the heat treatment was formed, is called, where applicable, a "high impurity concentration region". In FIGS. 2D and 3 to be described later, the high impurity concentration region is drawn as the "burying layer 2b".

A region formed by thermal diffusion and being continuous with the high impurity concentration region locates outside the high impurity concentration region. In this region formed by thermal diffusion, the p-type impurity concentration lowers gradually as the distance from the high impurity concentration region becomes longer. This region is called, where applicable, a "low impurity concentration region".

The p-type semiconductor well region between the charge accumulation region 2a and right side charge transfer channel 3a covered with the readout/transfer electrode 11a via only the insulating film 10 as viewed in plan, is used as the readout gate channel. In FIGS. 2D and 3 to be described later, the readout gate channel is represented by reference symbol 4a.

Each of the photodiodes shown in FIG. 1 has the charge accumulation region 2a and burying layer formed in the surface of the region 2a. A number of charge accumulation regions 2a are formed on the single semiconductor substrate 1 in a two-dimensional matrix shape, and the burying layer is formed in each of these charge accumulation regions 2a.

The solid state image pickup device 30 shown in FIG. 1 has four columns of charge accumulation regions.

One charge accumulation region column, corresponding charge transfer channel 3a, readout gate channels 4a, channel stopper region 5, and burying layers 2b constitute one unit. In the solid state image pickup device 30 shown in FIG. 1, four units are disposed in parallel.

Figure 3:
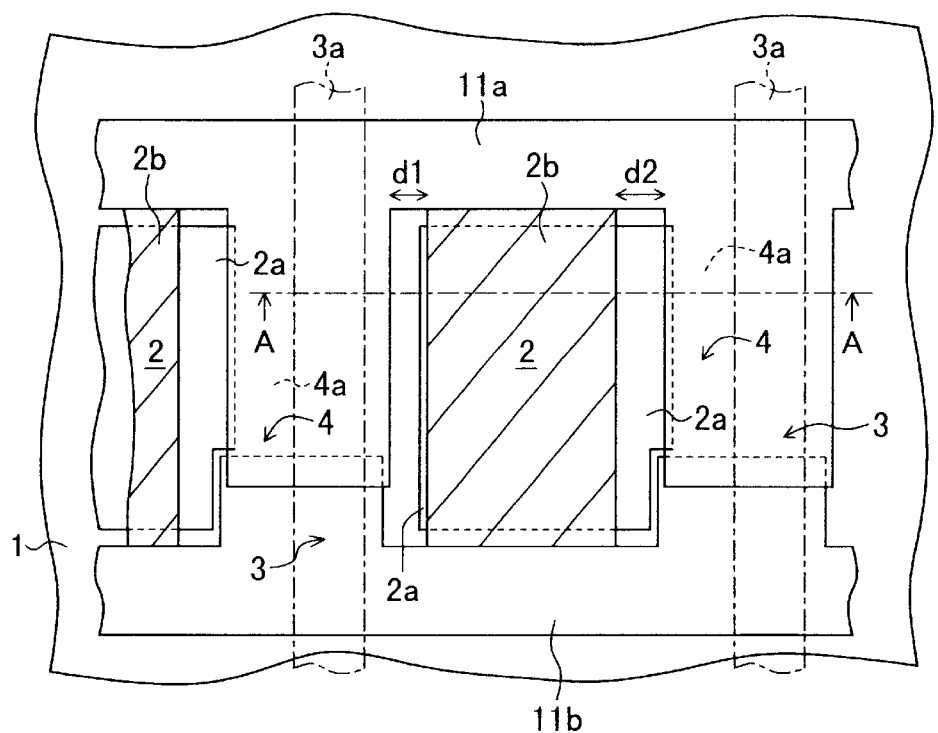
FIG. 3 is a plan view of a semiconductor substrate after the burying layer is formed during the manufacture processes for the solid-state image pickup device of the first embodiment.

FIG. 3 is a plan view of the substrate after the burying layers 2b were formed. The cross sectional view taken along line A—A in FIG. 3 corresponds approximately to the cross sectional view of FIG. 2C with the photoresist layer 15 being removed.

Referring to FIG. 3, each burying layer 2b indicated by hatched lines is formed in an inner area of a charge accumulation region 2a in the horizontal direction. The left end of each burying layer 2b is spaced by the distance d1 from a left side readout/transfer electrode 11a. The right end of each burying layer 2b is spaced by the distance d2 from a right side readout/transfer electrode 11a. Therefore, the surface of the charge accumulation region 2a is not covered with the burying layer 2b on the right and left sides of the burying layer 2b.

Each burying layer 2b reaches the outside of the charge accumulation region 2a in the direction from the upper area of the drawing of FIG. 3 to lower area (vertical direction), and contacts the channel stopper region (not visible in FIG. 3).

Each transfer-only electrode 11b is made of a first polysilicon layer, and each readout/transfer electrode 11a is made of a second polysilicon layer. The transfer-only electrodes 11b are first formed on the substrate, and then the readout/transfer electrodes 11a are formed over the transfer-only electrodes via insulating films. A readout/transfer electrode 11a partially overlaps a transfer-only electrode 11b in a depth direction of the drawing of FIG. 3 on the right side of a charge accumulation region 2a, with the insulating film being interposed therebetween. The readout/transfer electrode 11a and transfer-only electrode 11b are repetitively formed in a direction from the upper area of the drawing of FIG. 3 to lower area (vertical direction).

A partial area of the readout/transfer electrode 11a covers the readout gate channel 4a as viewed in plan, and constitutes a readout gate 4 together with the readout gate channel 4a. A readout pulse is applied to the readout/transfer electrode 11a.

Electric charge accumulated in the photodiode 2 is read out to the right side charge transfer channel 3a via the readout gate 4.

The charge transfer channel 3a constitutes a vertical transfer path 3 together with partial areas of each upper readout/transfer electrode 11a and each upper transfer-only electrode 11b.

Next, as shown in FIG. 2D, a light shielding film (Al film) 20 is formed which has a predetermined pattern and an opening above each burying layer 2b. A first planarizing layer 21 of phosphosilicate glass (PSG) or the like is formed over the substrate, and a second planarizing layer 22, color filters 23 and a third planarizing layer 24 are sequentially formed on the first planarizing layer 21. The second and third planarizing layers 22 and 24 are made of transparent material having electrical insulation.

A photoresist film having a predetermined pattern is formed on the third planarizing layer 24 by photolithography. Then, the photoresist film is heated to melt it and round the corners of the photoresist film by surface tension to thus form convex micro lenses 25.

The photodiode 2 has the burying layer 2b on its surface. This burying layer 2b is formed in a partial surface of the charge accumulation region 2a. The left end of the burying layer 2b is spaced from the channel stopper region 5 and the right end thereof is spaced from the readout gate channel 4a.

Figure 4:
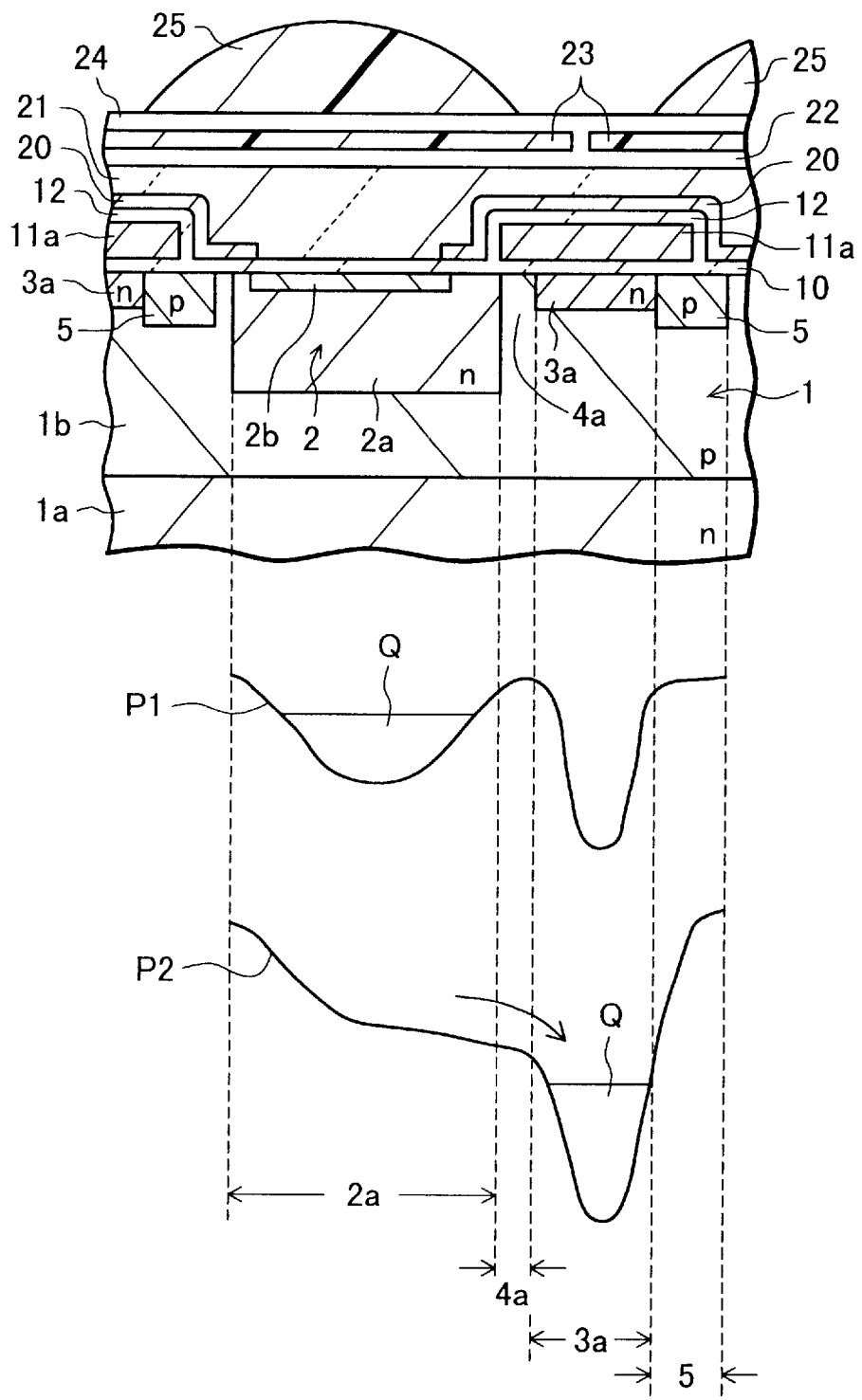
FIG. 4 shows a schematic cross sectional view of the solid-state image pickup device of the first embodiment and its potential diagrams.

FIG. 4 shows potential diagrams of the solid-state image pickup device 30 shown in FIG. 2D. The middle area of FIG. 4 shows a potential P1 relative to electrons near the surface of the semiconductor substrate while 0 V is applied to the readout/transfer electrode 11a. The lower area of FIG. 4 shows a potential P2 relative to electrons near the surface of the semiconductor substrate while a positive potential (e.g., 15 V) is applied to the readout/transfer electrode 11a.

As shown in the middle area of FIG. 4, while 0 V is applied to the readout/transfer electrode 11a, the potential at the charge accumulation region 2a and charge transfer channel 3a is high, whereas the potential at the readout gate channel 4a and channel stopper region 5 is low.

The micro lens 25 condenses incidence light to the photodiode 2 via the color filter 23. The color filter 23 passes light having a predetermined wavelength. The photodiode 2 receives incidence light having the predetermined wavelength, absorbs it and generates electric charge. Electric charge (electrons) Q corresponding to the quantity of the light is accumulated in the charge accumulation region 2a of the photodiode 2. The photodiode 2 corresponds to a pixel, and the accumulated charge Q corresponds to a pixel signal.

The readout gate channel 4a prevents the electric charge Q from being transferred from the photodiode 2 to the charge transfer channel 3a. Namely, the readout gate channel 4a forms a potential barrier.

As shown in the lower area of FIG. 4, as a positive potential (e.g., 15 V) is applied to the readout/transfer electrode 11a, the potential at the readout gate channel 4a becomes high. Since the charge accumulation region 2a exists between the burying layer 2b and right side readout gate channel 4a, the potential barrier in the readout gate channel 4a disappears.

Therefore, all the electric charge Q in the charge accumulation region 2a is efficiently transferred (read out) to the charge transfer channel 3a (vertical charge transfer path 3). Generation of retained image noises can be prevented.

Since the burying layer 2b and channel stopper region 5 contact each other in the vertical direction in FIG. 3, the potential of the burying layer 2b can be easily maintained at about 0 V even if the positive potential (e.g., 15 V) is applied to the readout/transfer electrode 11a.

As the positive potential (e.g., 15 V) is applied to the readout/transfer electrode 11a, a reverse bias is applied to the pn junction between the charge transfer channel 3a and right side channel stopper region 5.

However, as different from the solid-state image pickup device shown in FIG. 15, the charge accumulation region 2a exists between the channel stopper region 5 and right side burying layer 2b. The impurity concentration in the surface of the channel stopper region 5 is therefore almost equal to that in the lower portion in the channel stopper region 5.

It is therefore possible to prevent the pn junction from being broken down by the reverse bias. Since the breakdown can be prevented, generation of noises can be suppressed and the image quality can be improved.

Next, a solid-state image pickup device of the second embodiment will be described with reference to FIGS. 5, 6 and 7.

Figure 5:
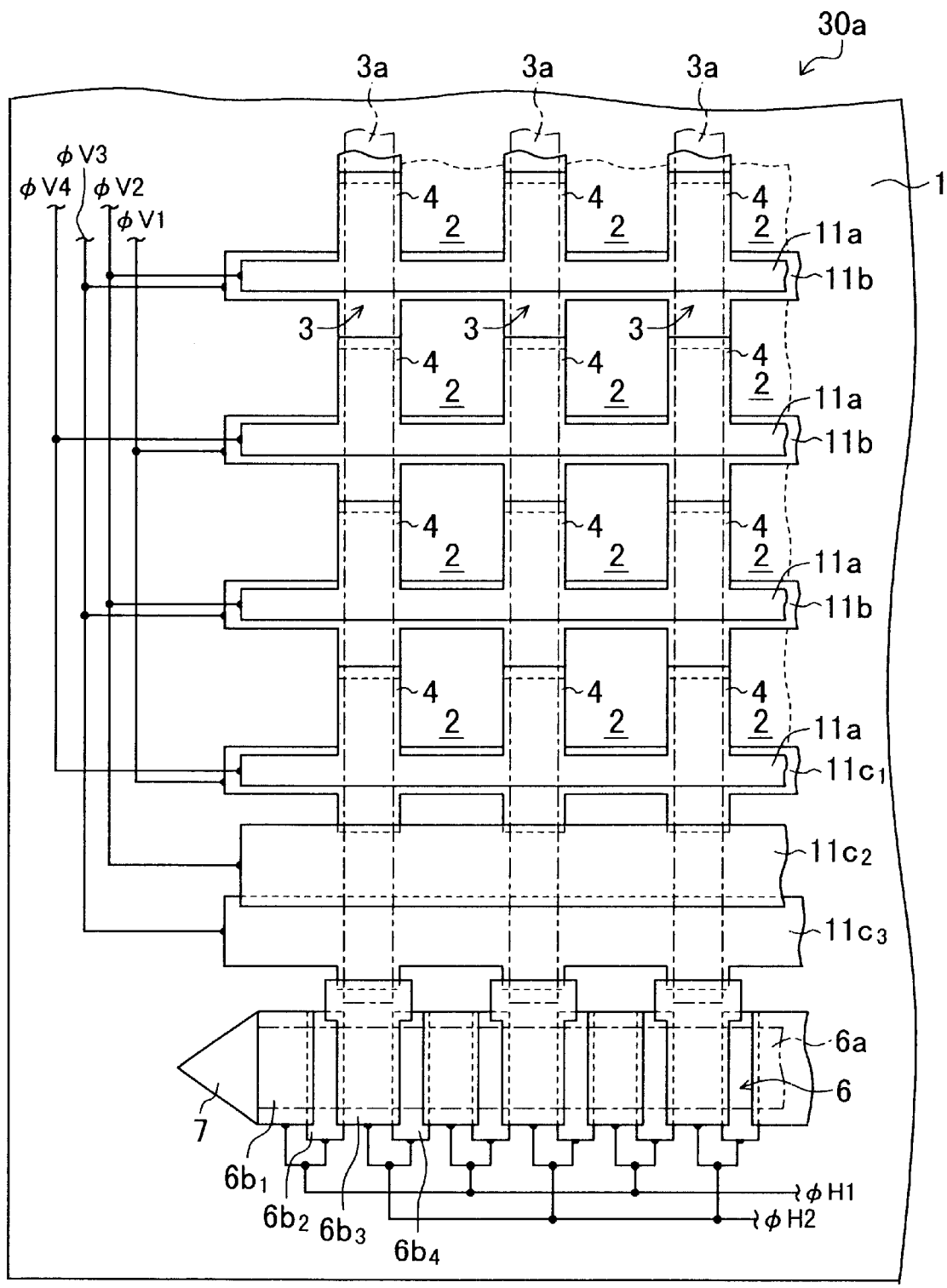
FIG. 5 is a partial plan view schematically showing the layout of photodiodes, vertical charge transfer paths, a horizontal charge transfer path and an output amplifier of a solid-state image pickup device according to a second embodiment.

FIG. 5 is a partial plan view schematically showing the layout of photodiodes, vertical charge transfer paths, a horizontal charge transfer path, and an output amplifier of the solid state image pickup device 30a of this embodiment.

Figure 6:
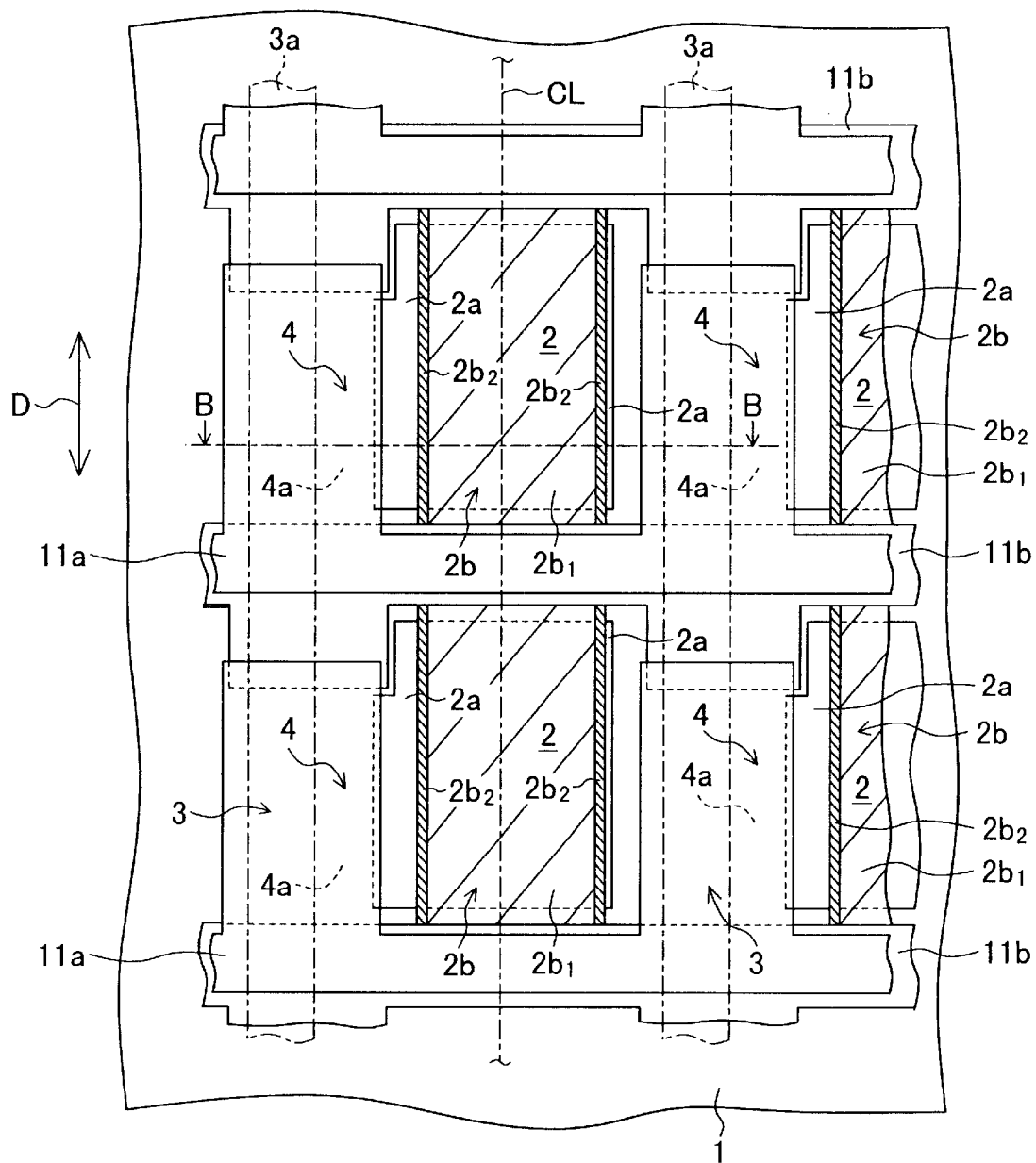
FIG. 6 is an enlarged plan view schematically showing several photodiodes and their peripheral areas of the solid-state image pickup device of the second embodiment.

FIG. 6 is an enlarged plan view schematically showing several photodiodes and their peripheral areas of the solid state image pickup device 30a. The cross sectional view taken along line B—B in FIG. 6 corresponds approximately to the cross sectional view of FIG. 2D with the light shielding film 20, first planarizing layer 21 and other upper components being removed.

Figure 7:
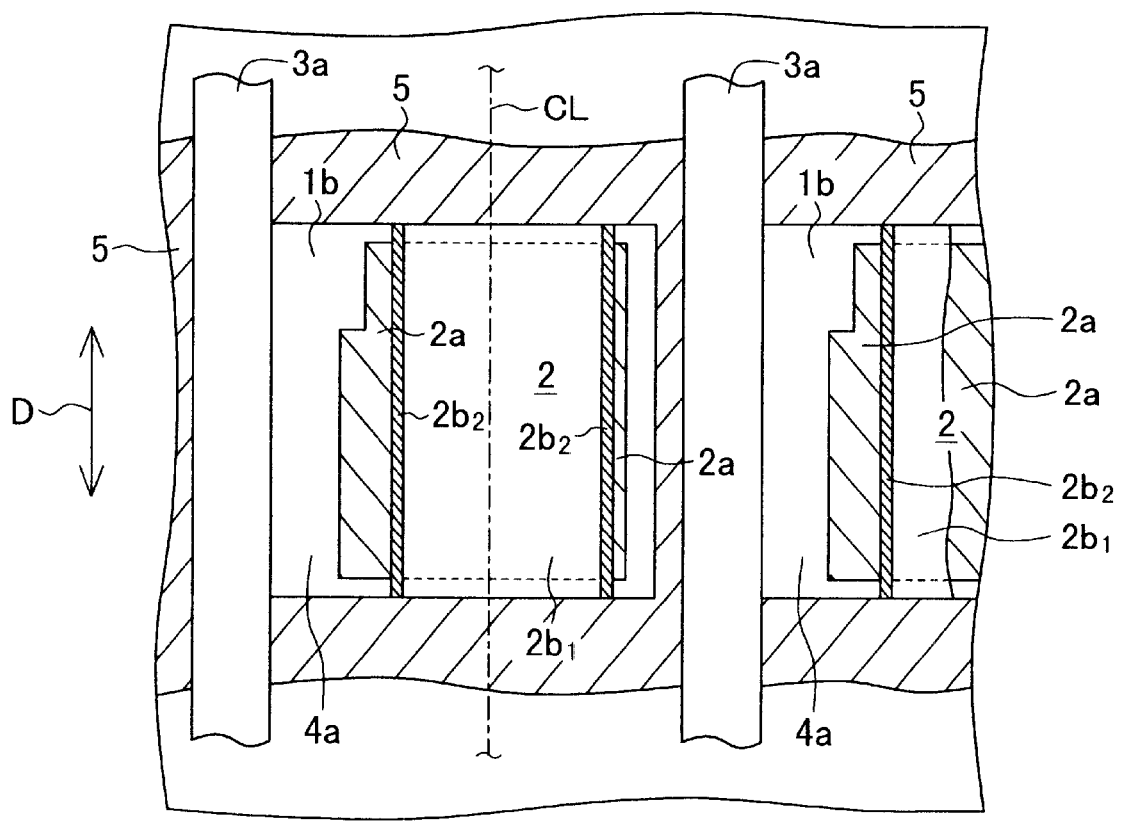
FIG. 7 is a plan view schematically showing the layout of photodiodes, charge transfer channels, readout gate channels, and channel stopper regions of the solid-state image pickup device of the second embodiment.

FIG. 7 is a plan view schematically showing the layout of photodiodes, charge transfer channels, readout gate channels, and channel stopper regions of the solid-state image pickup device 30a.

Of the constituent elements shown in FIGS. 5, 6 and 7, elements similar to those shown in FIGS. 1, 2D and 3 are represented by identical reference numerals and symbols used in FIGS. 1, 2D and 3, and the description thereof is omitted.

The solid state image pickup device 30a of the second embodiment is different from the solid state image pickup device 30 of the first embodiment in the following points (1) to (4). In the following description, the relative position of constituent elements and the like are defined by using terms such as "upstream side of . . . " and "downstream side of . . . " along a direction of flow of electric charges from the photodiode to the horizontal charge transfer path.

(1) On the left side of each photodiode column having photodiodes 2, a vertical charge transfer path 3 and readout gates 4 are formed.

(2) On the downstream side of the most downstream transfer-only electrode 11b, auxiliary transfer electrodes $11c_1$, $11c_2$, and $11c_3$ are formed for driving the vertical charge transfer paths 3 and horizontal charge transfer path 6 in a simple manner.

(3) Between the photodiode rows and on the downstream side of the most downstream photodiode row, a readout/transfer electrode 11a is formed over the transfer-only electrode 11b and auxiliary transfer electrode $11c_1$ via an insulating film.

(4) The control unit 8 shown in FIG. 1 is not formed.

The solid-state image pickup device 30a has the similar structure to that of the solid-state image pickup device 30 of the first embodiment, excepting the above points (1) to (4).

Similar to the solid state image pickup device 30, the solid state image pickup device 30a has a plurality of columns each having a plurality of charge accumulation regions 2a formed in the semiconductor well region 1b (refer to FIG. 2D).

A channel stopper region 5 includes one area extending along a column of charge accumulation regions with every column. This area of the channel stopper region 5 extends along a column of charge accumulation regions positions on the right side of this column as viewed in FIGS. 5, 6 and 7. Namely, this area positions on the opposite side of the charge transfer channel 3a relative to a central line (indicated by one-dot chain line CL in FIGS. 6 and 7) of the column.

In other words, this area of the channel stopper region 5 extending along a column of charge accumulation regions extends along and being contiguous to the charge transfer channel 3a corresponding to the right side column of charge accumulation regions as viewed in FIGS. 5, 6 and 7.

These areas of the channel stopper region 5 may be made integral on the upstream side of each charge transfer channel 3a, or may be made discrete.

Each of the areas of the channel stopper region 5 extending along a column of charge accumulation regions also extends along a direction perpendicular to the column direction D (arrow D in FIGS. 5 and 6) of charge accumulation regions, between adjacent charge accumulation regions 2a in the column direction, to the charge transfer channel 3a corresponding to this column.

Each of the readout/transfer electrodes 11a is formed on the downstream side of each row of charge accumulation regions and extends along this row. Each of the transfer-only electrodes 11b is formed on the upstream side of each row of charge accumulation regions and extends along this row.

The readout/transfer electrodes 11a and transfer-only electrodes 11b cross the charge transfer channels 3a as viewed in plan. The readout/transfer electrode 11a and transfer-only electrode 11b formed for each row of charge accumulation regions surround each of the charge accumulation regions 2a of this row as viewed in plan, except the charge accumulation regions 2a of the rightmost column (not shown).

Each of the readout/transfer electrodes 11a covers as viewed in plan the readout gate channels 4a of the corresponding column of charge accumulation regions. The area of the readout/transfer electrode 11a covering the readout gate channel 4a as viewed in plan constitutes the readout gate 4 together with the readout gate channel 4a.

Each of the auxiliary transfer electrodes $11c_1$, $11c_2$, and $11c_3$ extends along the row direction of charge accumulation regions and crosses each of the charge transfer channels 3a as viewed in plan.

The cross areas as viewed in plan between each charge transfer channel 3a and the transfer-only electrodes 11b, readout/transfer electrodes 11a, and auxiliary transfer electrode $11c_1$, $11c_2$ or $11c_3$ are combined along the column direction D of charge accumulation regions to constitute one vertical charge transfer path 3.

Each of the burying layers 2b is electrically connected to the channel stopper region 5 between adjacent two charge accumulation regions 2a in the column direction D.

One column of charge accumulation regions and the corresponding charge transfer channel 3a, readout gate channels 4a, channel stopper region 5 and burying layers 2b constitute one unit. In the solid-state image pickup device 30a, this unit and a plurality of units having a same structure as the unit are formed in parallel in the semiconductor well region 1b.

A high impurity concentration region $2b_1$ and a low impurity concentration region $2b_2$ constituting the burying layer 2b are shown in FIGS. 6 and 7. In order to make it easy to locate the high impurity concentration region $2b_1$ and low impurity concentration region $2b_2$, they are drawn hatched in FIG. 6. In order to make it easy to locate the charge accumulation region 2a, low impurity concentration region $2b_2$, and channel stopper region 5, they are drawn hatched in FIG. 7.

An example of wiring of four-phase drive signals φV1, φV2, φV3 and φV4 for driving the vertical charge transfer paths 3 and an example of the structure of the horizontal charge transfer path 6 made of two-phase drive type CCD are shown in FIG. 5.

The drive signals φV2 and φV4 include the readout pulse for reading out electric charge from the photodiode 2 to the vertical charge transfer path 3.

The horizontal charge transfer path 6 has a charge transfer channel 6a and four types of transfer electrodes $6b_1$, $6b_2$, $6b_3$, and $6b_4$.

The charge transfer channel 6a is formed, for example, by alternately forming n-type and n⁺-type regions in the semiconductor well region 1b (refer to FIG. 2D). The n-type impurity concentration in the n⁺-type region is higher than that in the n-type region.

The transfer electrodes $6b_2$ and $6b_4$ are formed over the n-type region in the charge transfer channel 6a, with an insulating film being interposed therebetween. The transfer electrodes $6b_1$ and $6b_3$ are formed over the n⁺-type region in the charge transfer channel 6a, with an insulating film being interposed therebetween.

The transfer electrodes $6b_1$, $6b_2$, $6b_3$, and $6b_4$ are formed for each vertical charge transfer path 3 (charge transfer channel 3a). The transfer electrodes $6b_1$, $6b_2$, $6b_3$, and $6b_4$ are disposed in this order from the output amplifier 7 side.

The transfer electrodes $6b_1$ and $6b_2$ are connected in common and supplied with a drive signal φH1. The transfer electrodes $6b_3$ and $6b_4$ are connected in common and supplied with a drive signal φH2.

The impurity concentration of the semiconductor well region 1b (refer to FIG. 2D) is selected in a range of about $5\times10^{14}$ cm⁻³ or larger and not larger than $1\times10^{17}$ cm⁻³, and more preferably in a range from about $1\times10^{15}$ to $1\times10^{16}$ cm⁻³.

The impurity concentration of the channel stopper region 5 is selected in a range of about $1\times10^{16}$ cm⁻³ or larger and not larger than $1\times10^{18}$ cm⁻³, and more preferably in a range from about $5\times10^{16}$ to $5\times10^{17}$ cm⁻³.

The impurity concentration of the charge accumulation region 2a is selected in a range of about $1\times10^{16}$ cm⁻³ or larger and not larger than $1\times10^{17}$ cm⁻³, and more preferably in a range from about $1.5\times10^{16}$ to $5\times10^{16}$ cm⁻³.

The impurity concentration of the high impurity concentration region $2b_1$ is selected in a range of about $1\times10^{18}$ cm⁻³ or larger and not larger than $1\times10^{20}$ cm⁻³, and more preferably in a range from about $2\times10^{18}$ to $5\times10^{19}$ cm⁻³.

The burying layer 2b of each photodiode 2 is spaced apart from the corresponding readout gate channel 4a.

The high impurity concentration region 2b, constituting the burying layer 2b is spaced apart from the channel stopper region 5 on the side opposite to the readout gate channel 4a relative to the center line CL of the column.

The low impurity concentration region $2b_2$ formed by thermal diffusion is continuous with the right and left sides as viewed in FIGS. 6 and 7 of the high impurity concentration region $2b_1$. The charge accumulation region 2a exists between the right low impurity concentration region $2b_2$ and right side channel stopper region 5.

If the readout pulse is about 15 V and the impurity concentrations of the charge accumulation region 2a and high impurity concentration region $2b_1$ are in the ranges described above, the width of the charge accumulation region 2a between the burying layer 2b and readout gate channel 4a as viewed in plan is selected in a range from about 0.3 to 1.5 μm.

Similarly, the width of the charge accumulation region 2a between the burying layer 2b and right side channel stopper region 5 as viewed in plan is selected in a range from about 0.1 to 1.0 μm.

In this specification, the "width of the charge accumulation region" between the burying layer and readout gate channel as viewed in plan means a width of the charge accumulation region along a direction perpendicular to, as viewed in plan, the extension direction of the charge transfer channel 3a at a part being contiguous to the readout gate channel 4a.

Also in this specification, the "width of the charge accumulation region" between the burying layer and channel stopper region as viewed in plan means a width of the charge accumulation region along a direction perpendicular to, as viewed in plan, the extension direction of the channel stopper region at a part where this charge accumulation region lies. As in a solid state image pickup device of the fifth embodiment to be described later, a plurality of extension directions of the channel stopper region used for defining the "width of the charge accumulation region" may exist. In such a case, the "width of the charge accumulation region" is defined by using the each extension direction of the channel stopper region corresponding to the charge accumulation region.

Each of the readout/transfer electrodes 11a is formed, as described earlier, between the photodiode rows and on the downstream side of the most downstream photodiode row, over the transfer-only electrode 11b and auxiliary transfer electrode $11c_1$ via an insulating film. Therefore, between the photodiode rows and on the downstream side of the most downstream photodiode row, the readout/transfer electrode 11a and semiconductor substrate 1 are electrically insulated to sufficient degree.

Since the burying layer 2b and channel stopper region 5 are electrically connected as described above, the potential of the burying layer 2b can be easily maintained at about 0 V while the readout pulse (e.g., 15 V) is applied to the readout/transfer electrode 11a.

From the similar reason to that of the solid-state image pickup device 30 of the first embodiment, it is possible to prevent generation of retained image noise.

Also from the similar reason to that of the solid state image pickup device 30 of the first embodiment, it is possible to prevent the breakdown of the pn junction between the charge transfer channel 3a and left side channel stopper region 5 as viewed in FIG. 7 while the readout pulse (e.g., 15 V) is applied to the readout/transfer electrode 11a. Generation of noises can therefore be suppressed.

Next, a solid-state image pickup device of the third embodiment will be described with reference to FIGS. 8 and 9.

Figure 8:
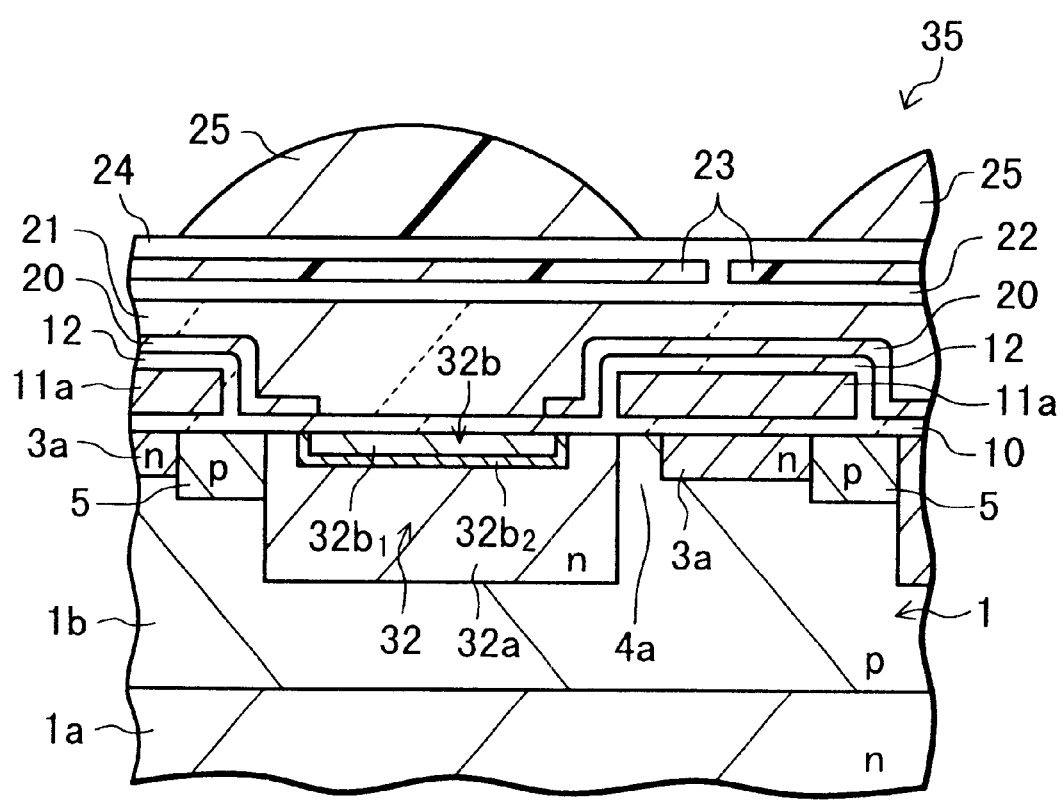
FIG. 8 is a schematic cross sectional view of a solid-state image pickup device according to a third embodiment.

FIG. 8 is a schematic cross sectional view of one photodiode and its peripheral area of a solid state image pickup device 35 of this embodiment.

Figure 9:
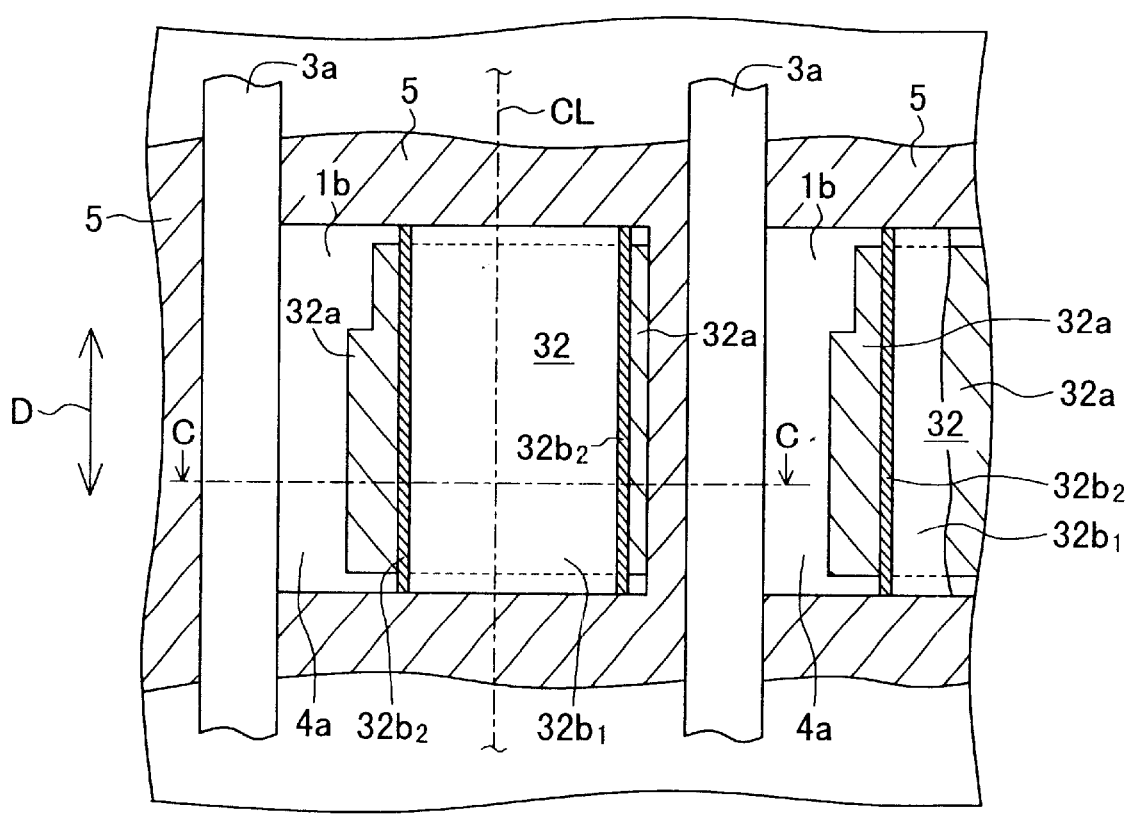
FIG. 9 is a plan view schematically showing the layout of photodiodes, charge transfer channels, readout gate channels, and channel stopper regions of the solid-state image pickup device of the third embodiment.

FIG. 9 is a plan view schematically showing the layout of photodiodes, charge transfer channels, readout gate channels, and channel stopper regions of the solid-state image pickup device 35. The cross sectional view taken along line C—C in FIG. 9 corresponds approximately to the cross sectional view of FIG. 8 with the insulating film 10 and upper components being removed.

Of the constituent elements shown in FIGS. 8 and 9, elements similar to those shown in FIG. 7 are represented by identical reference numerals and symbols used in FIG. 7, and the description thereof is omitted. All the constituent elements shown in FIG. 8 are shown in FIG. 2D. Therefore, in FIG. 8, of the constituent elements not shown in FIG. 7 but shown in FIG. 2D are represented by identical reference numerals and symbols used in FIG. 2D, and the description thereof is omitted.

However charge accumulation regions, burying layers, high impurity concentration regions, low impurity concentration regions, and photodiode shown in FIGS. 8 and 9 are represented by new reference numerals and symbols, with a numeral 30 being added to those numerals used in FIG. 7.

The different points of the solid state image pickup device 35 of this embodiment from the solid state image pickup device 30a of the second embodiment reside in that the left end of a charge accumulation region 32a as viewed in FIG. 8 is in contact with the left side channel stopper region 5, and that a distance between the left end of the charge accumulation region 32a as viewed in FIG. 8 and the left end of the burying layer 32b as viewed in FIG. 8 is longer than that of the solid state image pickup device 30a of the second embodiment. The other points are similar to those of the solid-state image pickup device 30a. In order to make it easy to locate the channel stopper regions 5, charge accumulation regions 32a and low impurity concentration regions $32b_2$, they are drawn hatched in FIG. 9.

Similar to the solid state image pickup device 30a of the second embodiment, in the solid state image pickup device 35, the potential of the burying layer 32b can be easily maintained at about 0 V while the readout pulse (e.g., 15 V) is applied to the readout/transfer electrode 11a.

From the similar reason to that of the solid-state image pickup device 30a of the second embodiment, it is possible to prevent generation of retained image noise.

Also from the similar reason as that of the solid state image pickup device 30a of the second embodiment, it is possible to prevent the breakdown of the pn junction between the charge transfer channel 3a and right side channel stopper region 5 as viewed in FIG. 8 while the readout pulse (e.g., 15 V) is applied to the readout/transfer electrode 11a. Generation of noises can therefore be suppressed.

If the readout pulse is about 15 V and the impurity concentrations of the charge accumulation region 32a and high impurity concentration region $32b_1$ are in the ranges previously described with the solid state image pickup device 30 of the second embodiment, the width of the charge accumulation region 32a between the burying layer 32b and readout gate channel 4a as viewed in plan is selected in a range from about 0.3 to about 1.5 µm.

Similarly, the width of the charge accumulation region 32a between the burying layer 32b and right side channel stopper region 5 as viewed in FIG. 9 is selected in a range from about 0.1 to about 1.0 µm.

Next, a solid state image pickup device of the fourth embodiment will be described with reference to FIGS. 10, 11 and 12.

Figure 10:
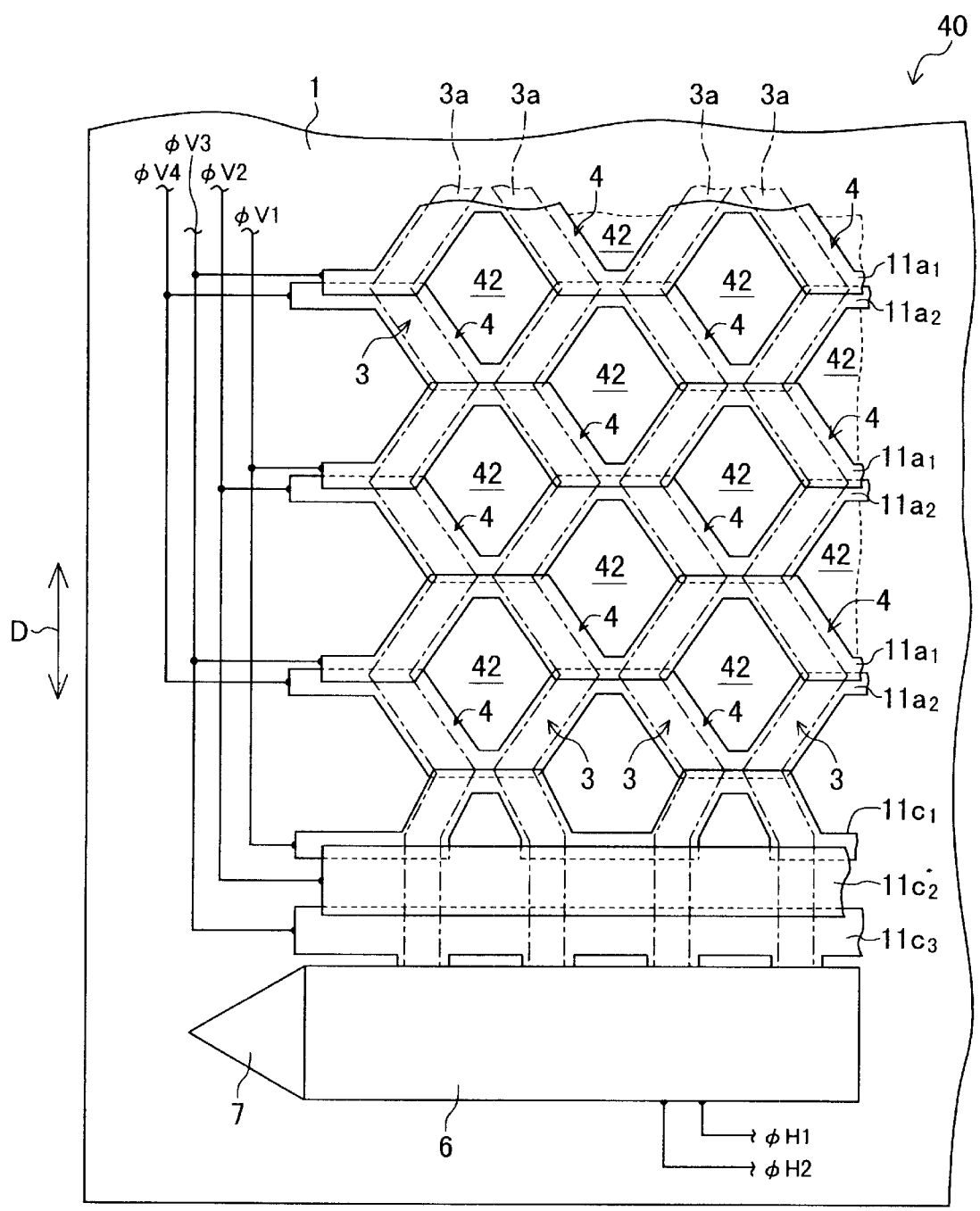
FIG. 10 is a partial plan view schematically showing the layout of photodiodes, vertical charge transfer paths, a horizontal charge transfer path and an output amplifier of a solid state image pickup device according to a fourth embodiment.

FIG. 10 is a partial plan view schematically showing the layout of photodiodes, vertical charge transfer paths, a horizontal charge transfer path and an output amplifier of a solid state image pickup device 40 of this embodiment.

Figure 11:
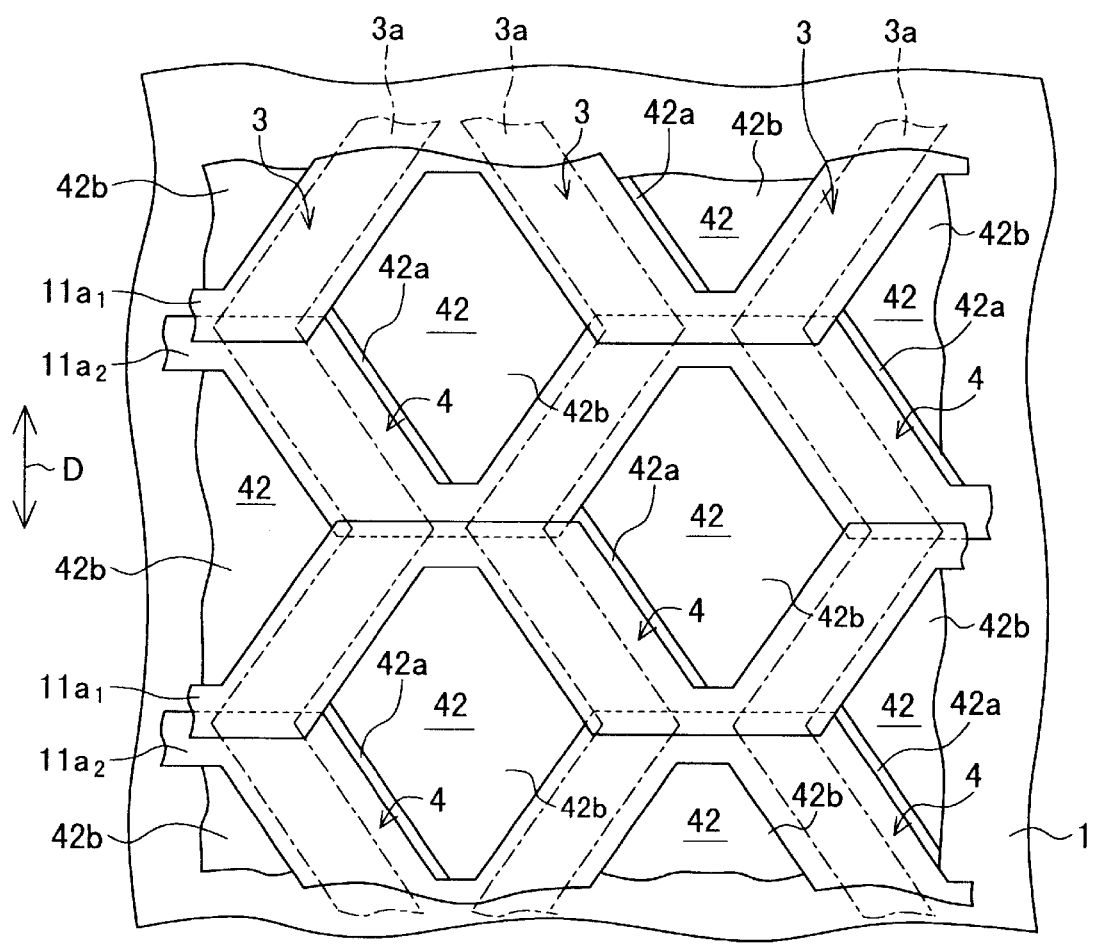
FIG. 11 is a plan view schematically showing several photodiodes and their peripheral areas of the solid-state image pickup device of the fourth embodiment.

FIG. 11 is a plan view schematically showing several photodiodes and their peripheral areas of the solid state image pickup device 40.

Figure 12:
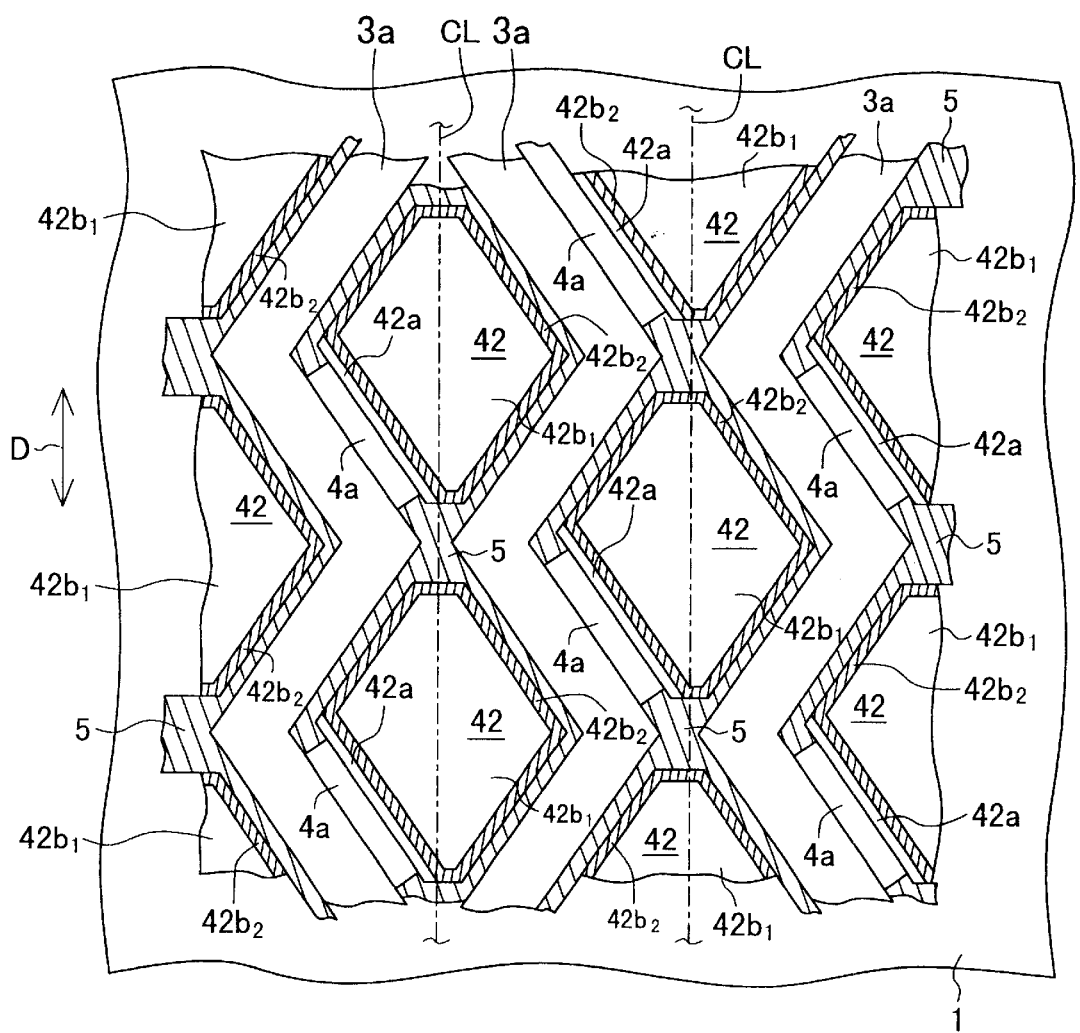
FIG. 12 is a plan view schematically showing the layout of photodiodes, charge transfer channels, readout gate channels, and channel stopper regions of the solid-state image pickup device of the fourth embodiment.

FIG. 12 is a plan view schematically showing the layout of photodiodes, charge transfer channels, readout gate channels, and channel stopper regions of the solid-state image pickup device 40.

Of the constituent elements shown in FIGS. 10, 11 and 12, those having functions similar to those described with FIGS. 5 and 6 are represented by identical reference numerals and symbols used in FIGS. 5 and 6, and the description thereof is omitted.

However charge accumulation regions, burying layers, high impurity concentration regions, low impurity concentration regions, and photodiodes shown in FIGS. 10 to 12 are represented by new reference numerals and symbols, with a numeral 40 being added to those numerals used in FIGS. 5 and 6.

In order to make it easy to locate the channel stopper regions 5 and the low impurity concentration regions $42b_2$, they are drawn hatched in FIG. 12.

The solid-state image pickup device 40 of this embodiment is different from the solid-state image pickup device 30a of the second embodiment in the following points (1) to (9).

(1) Each photodiode is generally hexagonal as viewed in plan, and each charge accumulation region 42a is also generally hexagonal.

(2) Photodiodes 42 are disposed in a shifted-pixel layout.

(3) Charge transfer channels 3a extend along the corresponding column of charge accumulation regions in the column direction D in a zigzag way on the left side of the column.

(4) Each readout gate channel 4a extends along the lower left oblique side of the corresponding charge accumulation region 42a as viewed in plan.

(5) Each channel stopper region 5 surrounds the charge accumulation region 42a as viewed in plan, excepting the area where the charge accumulation region 42a and readout gate channel 4a are contiguous to each other.

(6) A low impurity concentration region $42b_2$ in the burying layer 42b surrounds a high impurity concentration region $42b_1$ as viewed in plan.

(7) The channel stopper region 5 and low impurity concentration region $42b_2$ are in contact with each other, excepting the area where the readout gate channel 4a is formed and its nearby area.

(8) Electrodes corresponding to the transfer-only electrodes 11b of the solid-state image pickup device 30a of the second embodiment are not formed. All the transfer electrodes constituting the vertical charge transfer path 3 are readout/transfer electrodes $11a_1$ and $11a_2$, excepting the auxiliary transfer electrodes $11c_1$, $11c_2$ and $11c_3$.

(9) The readout/transfer electrodes $11a_1$ and $11a_2$ extend along the corresponding charge accumulation region row (photodiode row) in a zigzag way.

The solid-state image pickup device 40 has the similar structure to that of the solid-state image pickup device 30a excepting the above points (1) to (9).

In this specification, the "shifted-pixel layout" of a number of photodiodes means that each photodiode constituting an odd number photodiode column is shifted in the column direction by about a half of the pitch between photodiodes of the photodiode column, from each photodiode constituting an even number photodiode column, that each photodiode constituting an odd number photodiode row is shifted in the row direction by about a half of the pitch between photodiodes of the photodiode row, from each photodiode constituting an even number photodiode row, and that a number of photodiodes are disposed in a matrix layout in a plurality of rows and columns, each photodiode column including photodiodes of only odd or even rows.

In this specification, the phrase "about a half of the pitch between photodiodes of the photodiode column" is intended to include a value of a correct half and a value although it is deviated from the correct half because of factors such as a manufacture error and a rounding error of pixel positions to be caused by design parameters and mask manufacture parameters, it can be considered as substantially equal to the correct half from the viewpoint of the performance of the solid state image pickup device and quality of image reproduced by an equipment using the solid state image pickup device. Also in this specification, the phrase "about a half of the pitch between photodiodes of the photodiode row" is intended to include such values.

The shifted-pixel layout of a number of photodiodes also means such a layout of a number of charge accumulation regions. In this specification, therefore, the expression "shifted-pixel layout" is used also for a number of charge accumulation regions in some cases.

Each readout/transfer electrode $11a_1$ is formed on the upstream side of each row of charge accumulation regions. Each readout/transfer electrode $11a_2$ is formed on the downstream side of each row of charge accumulation regions.

The readout/transfer electrodes $11a_1$ and $11a_2$ cross the charge transfer channels 3a as viewed in plan. The readout/transfer electrode $11a_1$ and $11a_2$ formed for each row of charge accumulation regions surround each of the charge accumulation regions 42a of this row as viewed in plan, except the charge accumulation regions 42a of the rightmost column (not shown).

Each of the readout/transfer electrodes $11a_1$ covers as viewed in plan the readout gate channels 4a of the corresponding even row, as counted from the horizontal charge transfer path 6, of charge accumulation regions. Each of the readout/transfer electrodes $11a_2$ covers as viewed in plan the readout gate channels 4a of the corresponding odd row, as counted from the horizontal charge transfer path 6, of charge accumulation regions. The area of the readout/transfer electrodes $11a_1$ and $11a_2$ covering the readout gate channel 4a as viewed in plan constitutes the readout gate 4 together with the readout gate channel 4a.

The cross areas as viewed in plan between each charge transfer channel 3a and the readout/transfer electrodes $11a_1$ and $11a_2$ and auxiliary transfer electrode $11c_1$, $11c_2$ or $11c_3$ are combined along the column direction D of charge accumulation regions to constitute one vertical charge transfer path 3.

Similar to the solid state image pickup device 30a of the second embodiment, in the solid state image pickup device 40, the potential of the burying layer 42b can be easily maintained at about 0 V while the readout pulse (e.g., 15 V) is applied to the readout/transfer electrodes $11a_1$ and $11a_2$. Each of the drive signals $\phi V1$, $\phi V2$, $\phi V3$, and $\phi V4$ includes the readout pulse.

From the similar reason to that of the solid-state image pickup device 30a of the second embodiment, it is possible to prevent generation of retained image noise.

Also from the similar reason to that of the solid state image pickup device 30a of the second embodiment, it is possible to prevent the breakdown of the pn junction between the charge transfer channel 3a and contiguous channel stopper region 5 while the readout pulse (e.g., 15 V) is applied to the readout/transfer electrodes $11a_1$ and $11a_2$. Generation of noises can therefore be suppressed.

If the readout pulse is about 15 V and the impurity concentrations of the charge accumulation region 42a and high impurity concentration region $42b_1$ are in the ranges previously described with the solid state image pickup device 30a of the second embodiment, the width of the charge accumulation region 42a between the burying layer 42b and readout gate channel 4a as viewed in plan is selected in a range from about 0.3 to about 1.5 µm, similar to the corresponding width of the solid state image pickup device 30a of the second embodiment.

The width of the low impurity concentration region $42b_2$ on the side contacting the channel stopper region 5 is selected in a range from about 0.1 to about 0.4 µm.

In this specification, the "width of the low impurity concentration region on the side contacting the channel stopper region" means a width of the low impurity concentration region along a direction perpendicular to, as viewed in plan, the extension direction of the channel stopper region connecting the low impurity concentration region. As in the solid-state image pickup device 40 of this embodiment wherein the channel stopper regions extend along the column of charge accumulation regions in a zigzag way, a plurality of extension directions of the channel stopper region used for defining the "width of the low impurity concentration region" may exist.

Next, a solid-state image pickup device according to the fifth embodiment will be described with reference to FIGS. 13 and 14.

Figure 13:
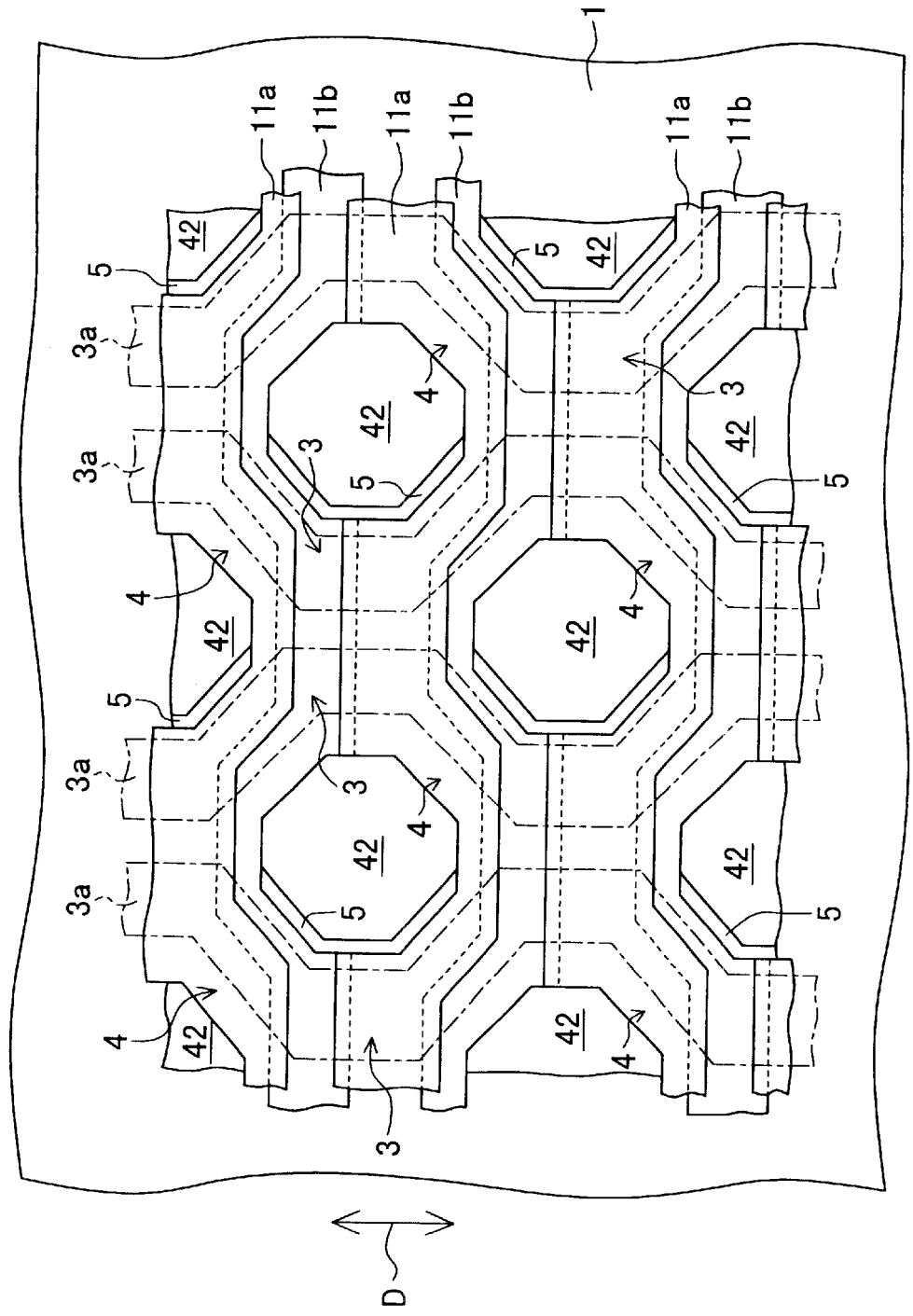
FIG. 13 is a plan view schematically showing several photodiodes and their peripheral areas of the solid-state image pickup device according to a fifth embodiment.

FIG. 13 is a plan view schematically showing several photodiodes and their peripheral areas of a solid-state image pickup device 45 of this embodiment.

Figure 14:
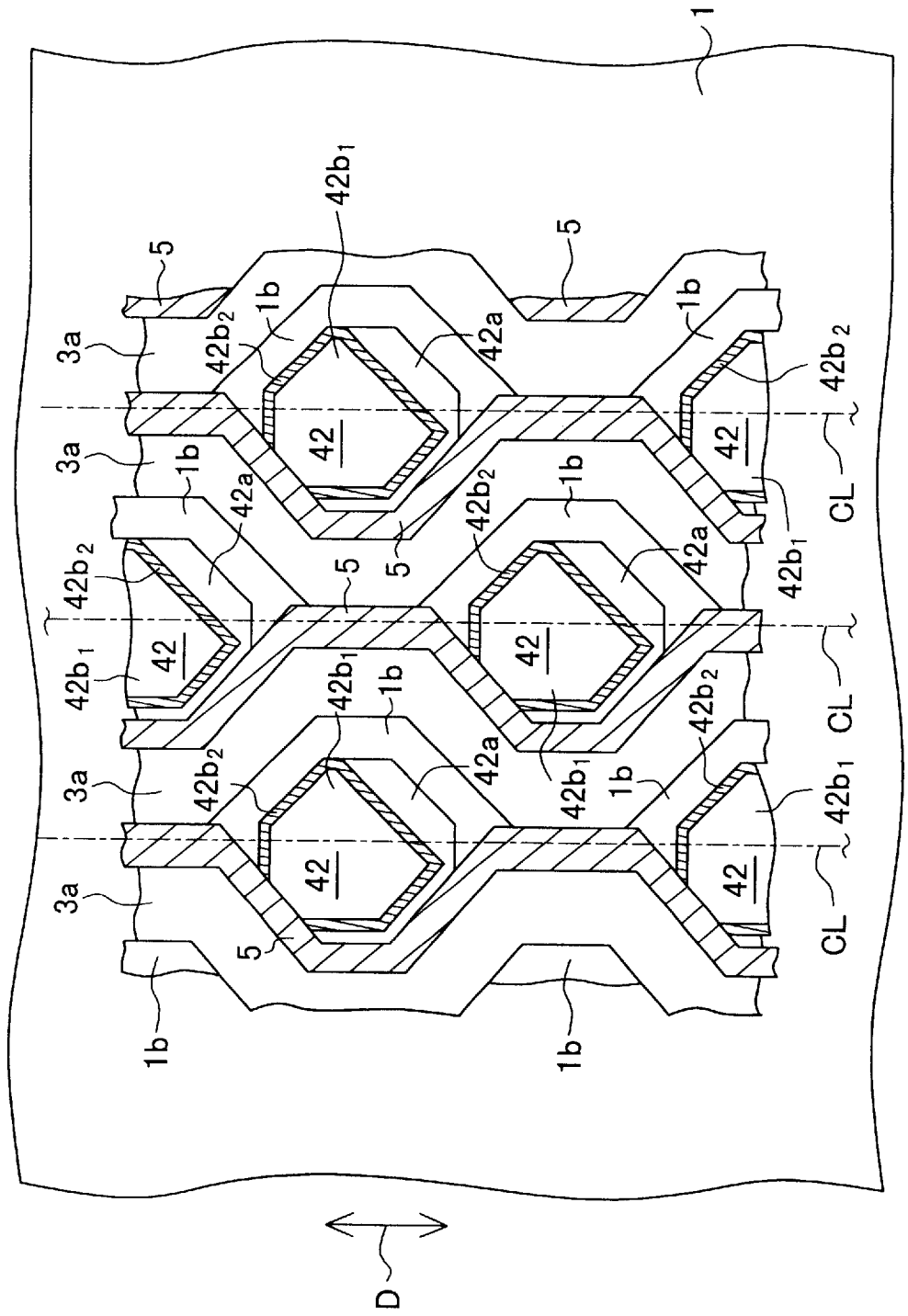
FIG. 14 is a plan view schematically showing the layout of photodiodes, charge transfer channels, readout gate channels, and channel stopper regions of the solid-state image pickup device of the fifth embodiment.

FIG. 14 is a plan view schematically showing the layout of photodiodes, charge transfer channels, readout gate channels, and channel stopper regions of the solid-state image pickup device 45.

Of the constituent elements shown in FIGS. 13 and 14, those having functions similar to those described with FIGS. 10, 11 and 12 are represented by identical reference numerals and symbols used in FIGS. 10, 11 and 12, and the description thereof is omitted.

In FIG. 13 only a partial area of the channel stopper region 5 is shown. In order to make it easy to locate the channel stopper regions 5 and low impurity concentration region $42b_2$, they are drawn hatched in FIG. 14.

The solid-state image pickup device 45 of this embodiment is considerably different from the solid-state image pickup device 40 of the fourth embodiment in the following points (1) to (7).

(1) Each photodiode is generally octagonal as viewed in plan, and each charge accumulation region 42a is also generally octagonal.

(2) Charge transfer channels 3a extend along the corresponding column of charge accumulation regions in the column direction D in a zigzag way on the right side of the column.

(3) One area of the semiconductor well region 1b exists between the charge accumulation region 42a and corresponding charge transfer channel 3a. Of this area, a partial area extending along the lower right oblique side of the charge accumulation region 42a as viewed in plan and its nearby area function as the readout gate channel. This area of the semiconductor well region 1b contacts as viewed in plan the channel stopper region 5 on the upstream and downstream sides of the charge accumulation regions 42a.

(4) The channel stopper region 5 for each column of charge accumulation regions extends along this column on the opposite side of the corresponding charge transfer channel 3a relative to the center line CL of the column. The channel stopper region 5 projects to the right from the center line CL as viewed in FIG. 14 between the two adjacent charge accumulation regions 42a along the column direction D, and connects the corresponding charge transfer channel 3a.

(5) The high impurity concentration region $42b_1$ contacts the channel stopper region 5 along a portion of the upper left oblique side of the charge accumulation region 42a as viewed in plan. The low impurity concentration region $42b_2$ surrounds as viewed in plan the high impurity concentration region $42b_1$, excepting the contact portion between the high impurity concentration region $42b_1$ and channel stopper region 5.

(6) The charge accumulation region 42a not covered with the burying layer 42b exists in the inner area than the lower left side and left side of the photodiode 42 besides the area being contiguous to the readout gate channel and its nearby area, as viewed in plan.

(7) One readout/transfer electrode 11a and one transfer-only electrode 11b are provided for each row of photodiodes. Each of the readout/transfer electrodes 11a extends in a zigzag way along the corresponding photodiode row on the downstream side. Each of the transfer-only electrodes 11b extends in a zigzag way along the corresponding photodiode row on the upstream side.

The solid-state image pickup device 45 has the similar structure to that of the solid-state image pickup device 40 excepting the above points (1) to (7).

Each readout/transfer electrode 11a and each transfer-only electrode 11b cross the charge transfer channels 3a as viewed in plan. The readout/transfer electrodes 11a and transfer-only electrodes 11b formed for each row of charge accumulation regions surround each of the charge accumulation regions 42a of this row as viewed in plan, except the charge accumulation regions 42a of the rightmost column (not shown).

Each of the readout/transfer electrodes 11a covers as viewed in plan the readout gate channels of the corresponding row of charge accumulation regions. The area of the readout/transfer electrodes 11a covering the readout gate channel as viewed in plan constitutes the readout gate 4 together with the readout gate channel.

The cross areas as viewed in plan between each charge transfer channel 3a and the readout/transfer electrodes 11a, transfer-only electrodes 11b and unrepresented auxiliary transfer electrode $11c_1$, $11c_2$ or $11c_3$ are combined along the column direction D of charge accumulation regions to constitute one vertical charge transfer path 3.

Similar to the solid state image pickup device 30a of the second embodiment, in the solid state image pickup device 45, the potential of the burying layer 42b can be easily maintained at about 0 V while the readout pulse (e.g., 15 V) is applied to the readout/transfer electrode 11a. The readout pulse is supplied to each readout/transfer electrode 11a.

From the similar reason to that of the solid-state image pickup device 30a of the second embodiment, it is possible to prevent generation of retained image noise.

Also from the similar reason to that of the solid state image pickup device 30a of the second embodiment, it is possible to prevent the breakdown of the pn junction between the charge transfer channel 3a and contiguous channel stopper region 5 while the readout pulse (e.g., 15 V) is applied to the readout/transfer electrode 11a. Generation of noises can therefore be suppressed.

If the readout pulse is about 15 V and the impurity concentrations of the charge accumulation region 42a and high impurity concentration region $42b_1$ are in the ranges previously described with the solid state image pickup device 30a of the second embodiment, the width of the charge accumulation region 42a between the burying layer 42b and readout gate channel as viewed in plan is selected in a range from about 0.3 to about 1.5 μm, similar to the corresponding width of the solid state image pickup device 30a of the second embodiment.

The width of the charge accumulation region 42a between the burying layer 42b and corresponding channel stopper region is selected in a range from about 0.1 to about 1.0 μm.

The embodiments of the solid-state image pickup device have been described. The invention is not limited only to the above embodiments.

For a monochromatic solid state image pickup device, color filters are solid state image pickup device and the like.

The shapes as viewed in plan of the readout/transfer electrode, transfer-only electrode and auxiliary transfer electrode are also selected in a manner described above.

Even if a number of photodiodes and charge accumulation regions are disposed in a shifted-pixel layout, the charge transfer channels may be formed along a straight line.

The shape as viewed in plan of the high impurity concentration region of the burying layer constituting the photodiode is selected in accordance with the shape of the charge accumulation region as viewed in plan, the shape of the readout/transfer electrode as viewed in plan, the shape of the channel stopper region as viewed in plan, and the like. The shape of the high impurity concentration region as viewed in plan is selected so that generation of retained image noise can be suppressed and the breakdown of he pn junction between the charge transfer channel and channel stopper region can be prevented.

The pn junction in concern is defined as in the following. Consider for example a solid state image pickup device for an area sensor. A column of charge accumulation regions is now called "charge accumulation region column A", a charge transfer channel for the charge accumulation region A is called "channel A", the next charge accumulation region column of the charge accumulation region column A is called "charge accumulation region column B" and a channel stopper region corresponding to the charge accumulation region column B and being contiguous to the channel A is called "channel stopper B". The pn junction is a junction between the channel A and channel stopper B, over which junction the readout/transfer electrode is disposed only via the insulating film.

In forming the burying layers on the charge accumulation regions, if the omitted or monochromatic color filters such as green and blue are used.

The semiconductor substrate in which photodiodes are formed may be an n-type semiconductor substrate with a p-type semiconductor well region or an n-type semiconductor substrate with a $p^-$-type epitaxially grown layer. The semiconductor substrate may be an insulating substrate with a semiconductor layer having: a desired conductivity type formed on the insulating substrate; and an impurity region having a desired conductivity type formed in the semiconductor layer, or an insulating substrate with a semiconductor layer having a desired conductivity type formed on the insulating substrate, an epitaxial layer being grown on the semiconductor layer and made of semiconductor having a desired conductivity type.

In this specification, the term "semiconductor substrate" is intended to include a substrate made of material other than semiconductor and formed with a semiconductor layer in which photodiodes, charge transfer channels and the like are formed.

The solid state image pickup device of the embodiments is of the type that electrons are transferred as charges. A solid state image pickup device of the type that holes are transferred as charges may also be used. In this case, the conductivity types p and n of each region are reversed.

The shape of a photodiode (charge accumulation region) as viewed in plan may be a rectangle (including a rhombus), a polygon having five angles or more and only obtuse inner angles, a polygon having five angles or more and acute and obtuse inner angles, a polygon having four angles or more with some rounded angles, or the like.

The shape of the charge transfer channel constituting the vertical charge transfer path is selected in accordance with the shape of each photodiode as viewed in plan, a layout specification of photodiodes, a necessary performance of a amount of p-type impurities reaching the surface of the channel stopper B, for example, through thermal diffusion, is reduced, the breakdown of the pn junction in concern can be prevented. Alternatively, if p-type impurities are prevented from reaching the surface of the channel stopper B, the breakdown of the pn junction in concern can be prevented.

To this end, the high impurity concentration region is formed in a predetermined area of the charge accumulation region in accordance with the shape of the charge accumulation region as viewed in plan, the shape of the readout/transfer electrode as viewed in plan, the shape of the channel stopper region as viewed in plan, and the like.

For example, each of the high impurity concentration regions may be formed in a lattice shape as viewed in plan.

The low impurity concentration region to be formed around the high impurity concentration region may be formed through thermal diffusion which essentially occurs when a heat treatment is performed for forming the burying layer, or may be intentionally formed through ion-implantation or the like. If the low impurity concentration region is formed by the intentional method, the impurity concentration of the low impurity concentration region may be generally uniform or may be gradually or stepwise lowered as the distance from the high impurity concentration region becomes longer.

If the plurality of columns of charge accumulation regions is formed in parallel on a semiconductor substrate, the leftmost or rightmost charge accumulation region column has no channel stopper region corresponding to the channel stopper B in some case. For this charge accumulation region column without channel stopper regions corresponding to the channel A, the burying layers may be formed on the charge accumulation regions constituting the charge accumulation region column without considering prevention of the breakdown of the pn junction.

The solid-state image pickup device of the embodiments can be used as an area sensor. If the number of charge accumulation region columns is set to about 1 to 4, the solid state image pickup device can be used as a line sensor (linear image sensor). In this case, the horizontal charge transfer path can be omitted and the output amplifier is directly connected to the downstream side of the vertical charge transfer path. In this case, the vertical charge transfer path may be made of two-phase drive type CCD.

If the solid-state image pickup device is used as a line sensor, light shielding film and micro lenses can be omitted.

The auxiliary transfer electrodes of the solid state image pickup device of the embodiments may be omitted. A CCD storage unit capable of storing electric charges of one frame may be provided between the most downstream photodiode row and the horizontal charge transfer path.

The vertical charge transfer path may be driven by three-phase, eight-phase or the like in addition to the four-phase drive. The scanning method may be interlace scanning, progressive scanning, 1/4 thinning scanning or the like.

Depending upon the scanning and driving methods, the number of transfer electrodes necessary for one charge accumulation region row becomes different, for example, two and four transfer electrodes. Therefore, the number of transfer electrodes per one charge accumulation region row is selected in accordance with the layout specification of charge accumulation region rows, the drive method for vertical charge transfer paths and the like.

As apparent from the comparison between the solid-state image pickup devices of the first and second embodiments, either the readout/transfer electrode or transfer-only electrode can be formed on the upstream side of the one charge accumulation region row. If the readout/transfer electrode is formed on the upstream side of the charge accumulation region row, a dummy electrode may be formed when necessary under the readout/transfer electrode of the most upstream charge accumulation region row. If an insulating film is formed on the surface of the dummy electrode and the readout/transfer electrode is formed on this insulating film, the readout/transfer electrode and semiconductor substrate can be electrically insulated to sufficient degree. Therefore, the potential of the burying layers can be easily maintained at about 0 V while the readout pulse (e. g., 15 V) is applied to the readout/transfer electrode. This is also applied to the solid-state image pickup device of the fourth embodiment and other solid-state image pickup devices having the transfer electrode structure similar to the fourth embodiment.

A vertical type overflow drain structure may be adopted to provide an electronic shutter function. In order to adopt the vertical type overflow drain structure, for example, a structure is provided which can apply a reverse bias between the p-type semiconductor well region and underlying n-type semiconductor substrate. In place of the vertical type overflow drain structure, a horizontal type overflow drain structure may be used. If a vertical or horizontal type overflow drain structure is provided, blooming can be suppressed.

It is apparent that various modifications, improvements, combinations, and the like can be made by those skilled in the art.

As described so far, according to the invention, generation of noises of a solid state image pickup device using photodiodes can be suppressed.

What is claimed is:

1. A solid-state image pickup device comprising:
   a semiconductor substrate formed with a semiconductor well region on a principal surface side;
   a charge accumulation region column having a plurality of charge accumulation regions formed in the semiconductor well region, each of the charge accumulation regions having a conductivity type opposite to a conductivity type of the semiconductor well region;
   a charge transfer channel formed in the semiconductor well region adjacent to said charge accumulation region column and extending along said charge accumulation region column, said charge transfer channel having the conductivity type opposite to the conductivity type of the semiconductor well region;
   a readout gate channel formed in the semiconductor well region for each charge accumulation region, said readout gate channel having a conductivity type same as the conductivity type of the semiconductor well region and being contiguous to a corresponding charge accumulation region and said charge transfer channel;
   a channel stopper region formed in the semiconductor well region and extending at least along said charge accumulation region column on an opposite side of said charge transfer channel relative to a center line of said charge accumulation region column, said channel stopper region having the conductivity type same as the conductivity type of the semiconductor well region and an impurity concentration higher than an impurity concentration of the semiconductor well region; and
   a burying layer formed on each charge accumulation region and being separated from said readout gate channel and electrically connected to said channel stopper region, said burying layer together with the charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated from said channel stopper region at least one area on the opposite side of said charge transfer channel relative to the center line of said charge accumulation region column.

2. A solid state image pickup device according to claim 1, wherein said channel stopper region extends in a direction crossing the direction of the charge accumulation region column between adjacent two charge accumulation regions of said charge accumulation region column, and reaches said charge transfer channel.

3. A solid state image pickup device according to claim 1, further comprising a low impurity concentration region formed in the one area where the high impurity concentration region is separated from said channel stopper region, said low impurity concentration region having an impurity concentration lower than the impurity concentration of the high impurity concentration region, being continuous with the high impurity concentration region, and extending on a side of said channel stopper region shorter than the high impurity concentration region.

4. A solid state image pickup device according to claim 3, wherein the impurity concentration of said low impurity concentration region becomes lower at a position remoter from the high impurity concentration region.

5. A solid-state image pickup device according to claim 3, wherein said low impurity concentration region has the conductivity type same as the conductivity type of the semiconductor well region.

6. A solid-state image pickup device according to claim 3, wherein said low impurity concentration region contacts said channel stopper region.

7. A solid state image pickup device according to claim 1, wherein in the one area where the high impurity concentration region is separated from said channel stopper region, the charge accumulation region exists as viewed in plan between the high impurity concentration region and said channel stopper region.

8. A solid-state image pickup device according to claim 1, wherein the semiconductor well region exists between the charge accumulation region and said channel stopper region.

9. A solid-state image pickup device according to claim 1, wherein the impurity concentration of the high impurity concentration region is $1 \times 10^{18}$ cm$^{-3}$ or higher and not higher than $1 \times 10^{20}$ cm$^{-3}$.

10. A solid state image pickup device according to claim 1, wherein the impurity concentration of said channel stopper region is $1 \times 10^{16}$ cm$^{-3}$ or higher and not higher than $1 \times 10^{18}$ cm$^{-3}$.

11. A solid state image pickup device according to claim 1, wherein the impurity concentration of the semiconductor well region is $1 \times 10^{15}$ cm$^{-3}$ or higher and not higher than $1 \times 10^{17}$ cm$^{-3}$.

12. A solid state image pickup device according to claim 1, wherein the impurity concentration of the charge accumulation region is $1\times10^{15}$ cm$^{-3}$ or higher, not higher than $1\times10^{17}$ cm$^{-3}$, and higher than the impurity concentration of the semiconductor well region.

13. A solid state image pickup device according to claim 1, wherein said charge accumulation region column and corresponding ones of said charge transfer channel, said readout gate channel, said channel stopper region, and said burying layer form one unit, the unit and a plurality of units having a same structure as the unit are formed in parallel in the semiconductor well region.

14. A solid-state image pickup device comprising:

a semiconductor substrate formed with a semiconductor well region on a principal surface side;

a number of charge accumulation regions formed in the semiconductor well region in a matrix form of a plurality of rows and columns, each of said charge accumulation regions having a conductivity type opposite to a conductivity type of the semiconductor well region;

a charge transfer channel formed for each charge accumulation region column in the semiconductor well adjacent to and along the charge accumulation region column, said charge transfer channel having the conductivity type opposite to the conductivity type of the semiconductor well region;

a readout gate channel formed in the semiconductor well region for each charge accumulation region, said readout gate channel having a conductivity type same as the conductivity type of the semiconductor well region and being contiguous to a corresponding charge accumulation region and said charge transfer channel corresponding to the charge accumulation region;

one or a plurality of channel stopper regions formed in the semiconductor well region and including one area for each charge accumulation region column extending along each charge accumulation region column, the one area existing on an opposite side of said charge transfer channel corresponding to the charge accumulation region column relative to a center line of the charge accumulation region column, said channel stopper region having the conductivity type same as the conductivity type of the semiconductor well region and an impurity concentration higher than an impurity concentration of the semiconductor well region;

a number of readout/transfer electrodes and transfer-only electrodes formed on said semiconductor substrate via an electrically insulating film, each of said readout/transfer electrodes being provided for each charge accumulation region row, extending along the charge accumulation region row, and covering as viewed in plan said readout gate channel corresponding to each of said charge accumulation regions of the charge accumulation region row, each of said transfer-only electrodes being provided at least for each charge accumulation region row and extending along the charge accumulation region row, said readout/transfer electrode and said transfer-only electrode surrounding as viewed in plan each of said charge accumulation regions of the charge accumulation region row; and a burying layer formed on each of said charge accumulation regions and being separated from said readout gate channel and electrically connected to said channel stopper region, said burying layer together with said charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated as viewed in plan from said readout/transfer electrode corresponding to said charge accumulation region under the high impurity concentration region.

15. A solid state image pickup device according to claim 14, further comprising a low impurity concentration region formed as viewed in plan between the high impurity concentration region and said readout/transfer electrode, said low impurity concentration region having an impurity concentration lower than the impurity concentration of the high impurity concentration region and being continuous with the high impurity concentration region.

16. A solid state image pickup device according to claim 14, wherein said charge accumulation region exists as viewed in plan between the high impurity concentration region and said channel stopper region, in a region between the high impurity concentration region and said readout/transfer electrode.

17. A solid-state image pickup device according to claim 14, wherein the semiconductor well region exists between said charge accumulation region and said channel stopper region.

18. A solid-state image pickup device comprising:

a semiconductor substrate formed with a semiconductor well region on a principal surface side;

a number of charge accumulation regions formed in the semiconductor well region in a matrix form of a plurality of rows and columns, each of said charge accumulation regions having a conductivity type opposite to a conductivity type of the semiconductor well region;

a charge transfer channel formed for each charge accumulation region column in the semiconductor well adjacent to and along the charge accumulation region column, said charge transfer channel having the conductivity type opposite to the conductivity type of the semiconductor well region;

a readout gate channel formed in the semiconductor well region for each charge accumulation region, said readout gate channel having a conductivity type same as the conductivity type of the semiconductor well region and being contiguous to a corresponding charge accumulation region and said charge transfer channel corresponding to the charge accumulation region;

one or a plurality of channel stopper regions formed in the semiconductor well region and including one area for each charge accumulation region column extending along each charge accumulation region column, the one area existing on an opposite side of said charge transfer channel corresponding to the charge accumulation region column relative to a center line of the charge accumulation region column, said channel stopper region having the conductivity type same as the conductivity type of the semiconductor well region and an impurity concentration higher than an impurity concentration of the semiconductor well region;

a number of readout/transfer electrodes formed on said semiconductor substrate via an electrically insulating film, said readout/transfer electrodes including a first readout/transfer electrodes each of which extending along an associated charge accumulation region row of said a plurality of rows on an immediately upstream side of the charge accumulation region row and a second readout/transfer electrodes each of which extending along an associated charge accumulation region row of said a plurality of rows on an immediately downstream side of the charge accumulation region row, the first and second readout/transfer electrodes provided for each charge accumulation region row surround as viewed in plan each of said charge accumulation regions of the charge accumulation region row; and a burying layer formed on each of said charge accumulation regions and being separated from said readout gate channel and electrically connected to said channel stopper region, said burying layer together with said charge accumulation region constituting a photodiode, said burying layer including a high impurity concentration region having the conductivity type same as the conductivity type of the semiconductor well region, an impurity concentration of the high impurity concentration region being generally uniform and higher than the impurity concentration of said channel stopper region, and the high impurity concentration region being separated as viewed in plan from the first and second readout/transfer electrodes surrounding as viewed in plan the charge accumulation region under the high impurity concentration region.

19. A solid state image pickup device according to claim 18, further comprising a low impurity concentration region formed as viewed in plan around the high impurity concentration region, said low impurity concentration region having an impurity concentration lower than the impurity concentration of the high impurity concentration region and being continuous with the high impurity concentration region and said channel stopper region.

20. A solid state image pickup device according to claim 19, wherein the impurity concentration of said low impurity concentration region becomes lower at a position remoter from the high impurity concentration region.

* * * * *